(12) United States Patent
Sato

(10) Patent No.: US 12,021,101 B2
(45) Date of Patent: Jun. 25, 2024

(54) IMAGING DEVICE

(71) Applicant: SONY SEMICONDUCTOR SOLUTIONS CORPORATION, Kanagawa (JP)

(72) Inventor: Naoyuki Sato, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 17/849,140

(22) Filed: Jun. 24, 2022

(65) Prior Publication Data

US 2022/0320167 A1  Oct. 6, 2022

Related U.S. Application Data

(63) Continuation of application No. 16/649,265, filed as application No. PCT/JP2018/029554 on Aug. 7, 2018, now Pat. No. 11,393,860.

(30) Foreign Application Priority Data

Oct. 3, 2017 (JP) .................................. 2017-193442

(51) Int. Cl.
*H01L 27/146* (2006.01)

(52) U.S. Cl.
CPC .............................. *H01L 27/14623* (2013.01)

(58) Field of Classification Search
None
See application file for complete search history.

(56) References Cited

U.S. PATENT DOCUMENTS

2013/0070131 A1  3/2013  Ohkubo et al.
2014/0131779 A1  5/2014  Takeda
(Continued)

FOREIGN PATENT DOCUMENTS

CN  103000644 A  3/2013
CN  103811507 A  5/2014
(Continued)

OTHER PUBLICATIONS

International Search Report and Written Opinion for International (PCT) Patent Application No. PCT/JP2018/029554, dated Oct. 9, 2018, 7 pages.
(Continued)

*Primary Examiner* — Nilufa Rahim
(74) *Attorney, Agent, or Firm* — SHERIDAN ROSS P.C.

(57) ABSTRACT

A solid-state imaging element includes an insulating film layer, a first light blocking film, and a wiring layer that are stacked on a second face of a semiconductor substrate, on a side opposite to a first face on which light is incident. The first light blocking film covers at least a formation region of a charge retention section and has a protrusion section protruding on a side of the semiconductor substrate in a part corresponding to a formation position of the second light blocking film. The second light blocking film has a first light blocking section between a photoelectric conversion section and the charge retention section that extends partway through the semiconductor substrate, a second light blocking section between a photoelectric conversion section and the charge retention section, and a third light blocking section covering a part of the first face.

20 Claims, 27 Drawing Sheets

(56) References Cited

U.S. PATENT DOCUMENTS

| | | |
|---|---|---|
| 2014/0327051 A1 | 11/2014 | Ahn et al. |
| 2015/0028405 A1 | 1/2015 | Minami et al. |
| 2015/0303235 A1* | 10/2015 | Yang ................. H01L 27/14614 257/292 |
| 2017/0117315 A1 | 4/2017 | Chen et al. |
| 2017/0134683 A1 | 5/2017 | Guyader et al. |
| 2018/0286905 A1* | 10/2018 | Tsao ................. H01L 27/14685 |
| 2018/0308883 A1 | 10/2018 | Yanagita et al. |
| 2018/0367748 A1* | 12/2018 | Mayer ................. H04N 25/768 |
| 2019/0221597 A1 | 7/2019 | Noh et al. |
| 2020/0185439 A1* | 6/2020 | Jin .................... H01L 27/14609 |
| 2020/0295068 A1 | 9/2020 | Sato |
| 2020/0343287 A1 | 10/2020 | Nakata et al. |
| 2021/0249456 A1 | 8/2021 | Miyanami et al. |

FOREIGN PATENT DOCUMENTS

| | | |
|---|---|---|
| JP | 2004-228407 | 8/2004 |
| JP | 2013-065688 | 4/2013 |
| JP | 2013084713 A | 5/2013 |
| JP | 2014-096490 | 5/2014 |
| JP | 2015-026708 | 2/2015 |
| JP | 2017-085091 | 5/2017 |
| WO | WO 2017/159361 | 9/2017 |

OTHER PUBLICATIONS

Notice of Allowance for U.S. Appl. No. 16/649,265, dated U.S. Appl. No. 16/649,265, dated Mar. 18, 2022, 10 pages.

* cited by examiner

IMAGING DEVICE

CROSS REFERENCE TO RELATED APPLICATIONS

This application is a continuation of U.S. patent application Ser. No. 16/649,265 filed 20 Mar. 2020, which is a national stage application under 35 U.S.C. 371 and claims the benefit of PCT Application No. PCT/JP2018/029554 having an international filing date of 7 Aug. 2018, which designated the United States, which PCT application claimed the benefit of Japanese Patent Application No. 2017-193442 filed 3 Oct. 2017, the entire disclosures of each of which are incorporated herein by reference.

TECHNICAL FIELD

The present disclosure relates to a solid-state imaging element, a method for manufacturing a solid-state imaging element, and an electronic device.

BACKGROUND ART

In a solid-state imaging element, for example in a back-side illumination CMOS image sensor having a global shutter function, a charge retention section that temporarily retains charge generated by a photoelectric conversion section is provided in a semiconductor substrate. If light is incident on the charge retention section, unnecessary charge occurs. Then, optical noise occurs in association with the unnecessary charge, and hence image quality is reduced. In this regard, conventionally, suppressing the incidence of light on the charge retention section has been studied.

For example, Patent Document 1 discloses a first Example in which, among the faces of a charge retention section, an upper face on the side of an incident face of a semiconductor substrate that light is incident on and a bottom face on the opposite side to the upper face are covered with a light blocking film. Thereby, not only light incident from the side of the incident face of the semiconductor substrate but also reflected light from a wiring layer stacked on a face on the opposite side to the incident face of the semiconductor substrate is prevented from being incident on the charge retention section.

Further, Patent Document 1 discloses a second Example in which an upper face and a side face of a charge retention section are covered with a light blocking film and some of the light blocking films on the side face sides are caused to pierce a semiconductor substrate. Thereby, light incident on the side face of the charge retention section can be blocked more surely.

CITATION LIST

Patent Document

Patent Document 1: Japanese Patent Application Laid-Open No. 2013-65688

SUMMARY OF THE INVENTION

Problems to be Solved by the Invention

However, in the first Example of Patent Document 1, the light blocking film covering the side face of the charge retention section is provided only up to partway through the semiconductor substrate, and a situation where light is incident from a portion of the side face not covered with the light blocking film cannot be prevented. Further, in the second Example of Patent Document 1, the bottom face of the charge retention section is not covered with the light blocking film, and hence a situation where light reflected from the wiring layer is incident on the charge retention section cannot be prevented.

Thus, an object of the present disclosure is to provide a back-side illumination solid-state imaging element in which the incidence of light on a charge retention section can be suppressed, a method for manufacturing the solid-state imaging element, and an electronic device including the solid-state imaging element.

Solutions to Problems

In order to achieve the object described above, there is provided a solid-state imaging element including:
  a photoelectric conversion section;
  a charge retention section configured to retain charge generated by the photoelectric conversion section;
  a semiconductor substrate in which the photoelectric conversion section and the charge retention section are formed;
  a wiring layer;
  an insulating film layer;
  a first light blocking film; and
  a second light blocking film,
  in which the insulating film layer, the first light blocking film, and the wiring layer are stacked on, of the semiconductor substrate, a second face on an opposite side to a first face on which light is incident, in this order from a side near to the second face,
  the first light blocking film is
  provided so as to cover at least a formation region of the charge retention section and has a protrusion section protruding on a side of the semiconductor substrate in a part corresponding to a formation position of the second light blocking film, and
  the second light blocking film has
  a first light blocking section placed between a photoelectric conversion section and the charge retention section and extending from the first face of the semiconductor substrate up to partway through the semiconductor substrate,
  a second light blocking section placed between a photoelectric conversion section and the charge retention section and configured to be longer than the first light blocking section, and
  a third light blocking section covering a part of the first face of the semiconductor substrate. Further, the electronic device to achieve the object described above includes a solid-state imaging element having the configuration described above.

In order to achieve the object described above, there is provided a method for manufacturing a solid-state imaging element including
  a photoelectric conversion section,
  a charge retention section configured to retain charge generated by the photoelectric conversion section,
  a semiconductor substrate in which the photoelectric conversion section and the charge retention section are formed,
  a wiring layer,
  an insulating film layer,
  a first light blocking film, and
  a second light blocking film, in which the insulating film layer, the first light blocking film, and the wiring layer are stacked on, of the semiconductor substrate, a second face on an opposite side to a first face on which light is incident, in this order from a side near to the second face, the method including:

forming the first light blocking film such that the first light blocking film is provided so as to cover at least a formation region of the charge retention section and a protrusion section protruding on a side of the semiconductor substrate is formed in a part corresponding to a formation position of the second light blocking film; and forming the second light blocking film such that a first light blocking section extending from the first face of the semiconductor substrate up to partway through the semiconductor substrate is formed between a photoelectric conversion section and the charge retention section, a second light blocking section longer than the first light blocking section is formed between a photoelectric conversion section and the charge retention section, and a third light blocking section covering a part of the first face of the semiconductor substrate is formed.

Effects of the Invention

According to the present disclosure, in a back-side illumination solid-state imaging element having a charge retention section, the incidence of light on the charge retention section can be suppressed.

Note that the effect described here is not a limitation necessarily, but one of the effects described in the present specification may be achieved. Also, the effect described in the present specification is just an example and is not limited thereto, and an additional effect may be enabled.

MODE FOR CARRYING OUT THE INVENTION

Figure 1:
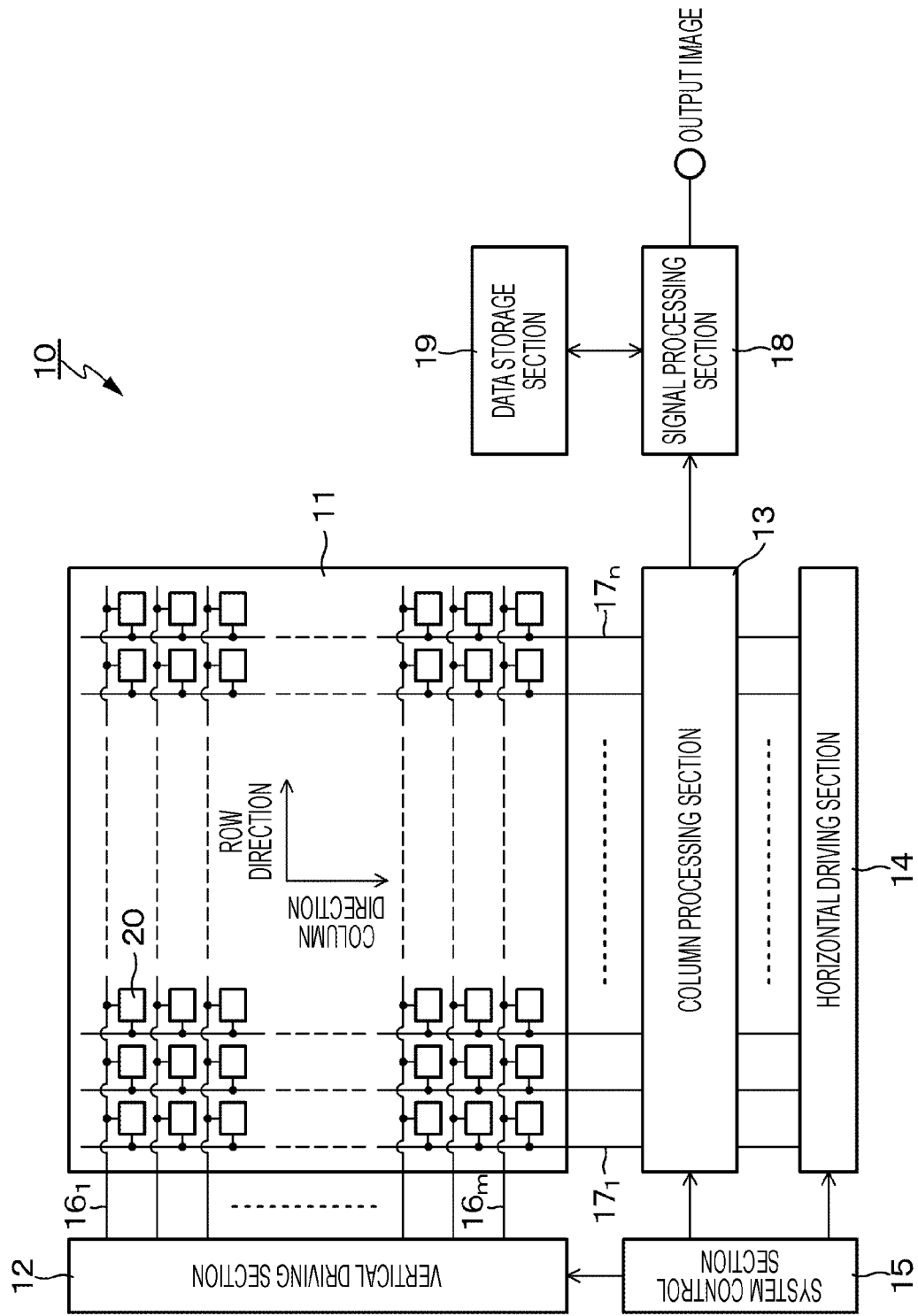
FIG. 1 is a block diagram showing a configuration example of a CMOS image sensor that is an example of a solid-state imaging element to which the technology according to the present disclosure is applied.

In the following, a mode for carrying out the technology according to the present disclosure (hereinafter, referred to as "embodiment") will be described in detail by using drawings. The technology according to the present disclosure is not limited to the embodiment, and various numerical values and materials in embodiments are examples. In the below description, the same reference signs are used for the same elements or the elements having the same function, and repetitive description is omitted. Note that the description is given in the following order.

1. Overall description regarding solid-state imaging element of present disclosure, method for manufacturing the same, and electronic device
2. First Embodiment
2-1. Configuration example of CMOS image sensor
2-2. Configuration example of unit pixel
2-3. Light blocking structure of CMOS image sensor
2-3-1. Example 1 (example of basic structure of light blocking structure)
2-3-2. Example 2 (example of method for manufacturing light blocking structure)
2-3-3. Example 3 (modification example of light blocking structure according to Example 1)
2-3-4. Example 4 (modification example of light blocking structure according to Example 1)
2-3-5. Example 5 (modification example of light blocking structure according to Example 1)
2-3-6. Example 6 (modification example of Example 4+Example 5)
2-3-7. Example 7 (modification examples of Example 1: pattern examples of protrusion section of first light blocking film)
3. Second Embodiment
4. Modification examples
5. Application examples
6. Use examples of technology according to present disclosure
6-1. Electronic device of present disclosure (example of image-capturing device)
6-2. Application example to moving object
7. Configurations possibly employed by present disclosure <Overall Description Regarding Solid-State Imaging Element of Present Disclosure, Method for Manufacturing the Same, and Electronic Device>

The fact that, in a solid-state imaging element of the present disclosure, an insulating film layer, a first light blocking film, and a wiring layer are stacked on, of a semiconductor substrate, a second face on the opposite side to a first face on which light is incident, in this order from the side near to the second face, means that the solid-state imaging element of the present disclosure is a back-side illumination type. That is, assuming that the second face on which the wiring layer is stacked is a front face (a frontage face), the solid-state imaging element of the present disclosure has a back-side illumination pixel structure that takes in applied light from the side of a back face (the first face) on the opposite side to the second face.

In a solid-state imaging element of the present disclosure, a method for manufacturing the same, and an electronic device, a configuration in which a protrusion section of a first light blocking film is provided in a part corresponding to the formation position of at least one of a first light blocking section or a second light blocking section of a second light blocking film is possible. In this event, a configuration in which the protrusion section of the first light blocking film is provided in a part more on the side of a photoelectric conversion section than immediately below the formation position of at least one of the first light blocking section or the second light blocking section of the second light blocking film or is provided in a part immediately below the formation position of at least one of the first light blocking section or the second light blocking section of the second light blocking film is preferable.

In the solid-state imaging element of the present disclosure, the method for manufacturing the same, and the electronic device including the preferred configuration described above, a configuration in which a first light blocking film is provided so as to cover the formation region of a photoelectric conversion section is possible. Further, a configuration in which a protrusion section of a first light blocking film is provided in a state of protruding into an insulating film layer or in a state of protruding into a semiconductor substrate via an insulating film layer is preferable.

Furthermore, in the solid-state imaging element of the present disclosure, the method for manufacturing the same, and the electronic device including the preferred configurations described above, a configuration in which a first light blocking section and a second light blocking section are linked via a third light blocking section in a direction parallel to the first face of a semiconductor substrate is possible. Furthermore, a configuration in which a side face of a photoelectric conversion section is surrounded by a first light blocking section and a second light blocking section is possible. Furthermore, a configuration in which a first light blocking section is placed at least between a photoelectric conversion section and a transfer gate section for transferring charge from the photoelectric conversion section to a charge retention section and a second light blocking section is placed at least between a photoelectric conversion section of one unit pixel of mutually adjacent unit pixels and a charge retention section of the other unit pixel is possible.

Furthermore, in the solid-state imaging element of the present disclosure, the method for manufacturing the same, and the electronic device including the preferred configurations described above, a configuration in which an insulating film layer includes two layers of a first insulating film and a second insulating film with different compositions, and the first insulating film and the second insulating film are stacked on the second face of a semiconductor substrate in this order from the side near to the second face is possible. A configuration in which the first insulating film includes an oxide film and the second insulating film includes a nitride film is possible.

Furthermore, in the solid-state imaging element of the present disclosure, the method for manufacturing the same, and the electronic device including the preferred configurations described above, a configuration in which an insulating film layer is a three-layer structure including a third insulating film including an oxide film on the side of a second insulating film opposite to a first insulating film is possible. In this three-layer structure, it is preferable that the thickness of the first insulating film be more than or equal to 10 nm, the thickness of the second insulating film be more than or equal to 50 nm, and the thickness of the third insulating film be more than or equal to 25 nm. Further, a configuration in which a second light blocking section pierces the first insulating film and extends up to the second insulating film is possible.

Further, in another solid-state imaging element of the present disclosure,
a configuration in which a solid-state imaging element includes:
a photoelectric conversion section;

a charge retention section configured to retain charge generated by the photoelectric conversion section;

a semiconductor substrate in which the photoelectric conversion section and the charge retention section are formed;

a wiring layer;

an insulating film layer;

a first light blocking film; and a second light blocking film, in which the first light blocking film is provided so as to cover at least a formation region of the charge retention section and has a protrusion section protruding on a side of the semiconductor substrate in a part corresponding to a formation position of the second light blocking film, and the second light blocking film has a surface light blocking section provided in a bottom portion of a dug portion of a region of a first face of the semiconductor substrate corresponding to the formation region of the charge retention section, and a side face light blocking section extending from the surface light blocking section along a side face of the charge retention section is possible.

In another solid-state imaging element of the present disclosure, a configuration in which the protrusion section of the first light blocking film is provided in a state of protruding into the insulating film layer or in a state of protruding into the semiconductor substrate via the insulating film layer is possible.

First Embodiment

First, a solid-state imaging element according to a first embodiment of the present disclosure and a method for manufacturing the same, more specifically a solid-state imaging element having a back-side illumination pixel structure and a method for manufacturing the same are described.

[Configuration Example of CMOS Image Sensor]

FIG. 1 is a block diagram showing a configuration example of a complementary metal oxide semiconductor (CMOS) image sensor that is an example of a solid-state imaging element to which the technology according to the present disclosure is applied.

A CMOS image sensor 10 includes a pixel array section 11, a vertical driving section 12, a column processing section 13, a horizontal driving section 14, and a system control section 15. The pixel array section 11, the vertical driving section 12, the column processing section 13, the horizontal driving section 14, and the system control section 15 are formed on a not-illustrated semiconductor substrate (chip).

In the pixel array section 11, unit pixels 20 each including a photoelectric conversion section that generates an amount of light charge according to the amount of incident light and accumulates the light charge in the interior are two-dimensionally arranged in a matrix form. The unit pixel 20 has a back-side illumination pixel structure (see FIG. 3). Hereinbelow, an amount of light charge according to the amount of incident light may be simply written as "charge", and the unit pixel may be simply written as a "pixel".

In the pixel array section 11, further, a pixel driving line 16 ($16_1$ to $16_m$) is formed for each row along the left-right direction of the drawing (the arrangement direction of pixels of a pixel row), and a vertical signal line 17 ($17_1$ to $17_n$) is formed for each column along the up-down direction of the drawing (the arrangement direction of pixels of a pixel column), for a pixel arrangement of m rows and n columns. One end of the pixel driving line 16 is connected to an output end corresponding to each row of the vertical driving section 12.

The CMOS image sensor 10 further includes a signal processing section 18 and a data storage section 19. The signal processing section 18 and the data storage section 19 may be worked by processing by an external signal processing section provided on a substrate different from the substrate of the CMOS image sensor 10, such as a digital signal processor (DSP) or a software application, or may be mounted on the same substrate as the substrate of the CMOS image sensor 10.

The vertical driving section 12 includes a shift register, an address decoder, etc., and is a pixel driving section that drives each pixel 20 of the pixel array section 11 on a simultaneously-for-all-pixels basis, on a row basis, etc. Although the illustration of a specific configuration of the vertical driving section 12 is omitted, the vertical driving section 12 includes a read scanning system and a sweep scanning system, and can perform collective sweeping and collective transfer by driving by these scanning systems.

The read scanning system selectively scans unit pixels 20 of the pixel array section 11 on a row basis in a successive manner in order to read out a signal from the unit pixel 20. In a case of row driving (rolling shutter operation), for sweeping, sweep scanning is performed on a reading row on which read scanning is to be performed by the read scanning system, earlier than the read scanning by an amount equal to the shutter speed. Further, in a case of global exposure (global shutter operation), collective sweeping is performed earlier than collective transfer by an amount equal to the shutter speed.

By the sweeping, unnecessary charge is swept out (is reset) from the photoelectric conversion section of the unit pixel 20 of the reading row. Then, what is called electronic shutter operation is performed by the sweeping (resetting) of unnecessary charge. Here, the electronic shutter operation refers to an operation of discarding light charge of the photoelectric conversion section and newly starting exposure (starting the accumulation of light charge).

The signal that is read out by the read operation by the read scanning system is a signal corresponding to the amount of light incident from the time of the immediately preceding read operation or electronic shutter operation. In a case of row driving, the period from the reading timing based on the immediately preceding read operation or the sweeping timing based on the electronic shutter operation to the reading timing based on the present round of read operation is the period of the accumulation of light charge (exposure period) in the unit pixel. In a case of global exposure, the period from collective sweeping to collective transfer is the accumulation period (exposure period).

Pixel signals outputted from the unit pixels 20 of the pixel rows selectively scanned by the vertical driving section 12 are supplied to the column processing section 13 through the vertical signal lines 17. The column processing section 13 performs prescribed signal processing on a pixel signal that is outputted from each unit pixel 20 of the selected row through the vertical signal line 17, and temporarily retains the pixel signal after signal processing, in units of pixel columns of the pixel array section 11.

Specifically, the column processing section 13 performs, as signal processing, at least denoising processing, for example correlated double sampling (CDS) processing. By the correlated double sampling by the column processing section 13, fixed pattern noise peculiar to the pixel, such as reset noise and threshold variation between amplification transistors (see FIG. 2), is removed. Note that the column processing section 13 may be provided with, for example, an analog-digital (AD) conversion function as well as the denoising processing function, and may output the signal level by means of a digital signal.

The horizontal driving section 14 includes a shift register, an address decoder, etc., and sequentially selects unit circuits corresponding to pixel columns of the column processing section 13. By the selective scanning by the horizontal driving section 14, pixel signals that have undergone signal processing by the column processing section 13 are sequentially outputted to the signal processing section 18.

The system control section 15 includes a timing generator that generates various timing signals, etc., and uses various timing signals generated by the timing generator to perform driving control of the vertical driving section 12, the column processing section 13, the horizontal driving section 14, etc.

The signal processing section 18 has at least an addition processing function, and performs various pieces of signal processing such as addition processing on a pixel signal outputted from the column processing section 13. The data storage section 19 temporarily stores data necessary for signal processing in the signal processing section 18 at the time of the processing.

[Configuration Example of Unit Pixel]

Next, a specific configuration of each of the unit pixels 20 arranged in a matrix form in the pixel array section 11 of FIG. 1 is described.

Figure 2:
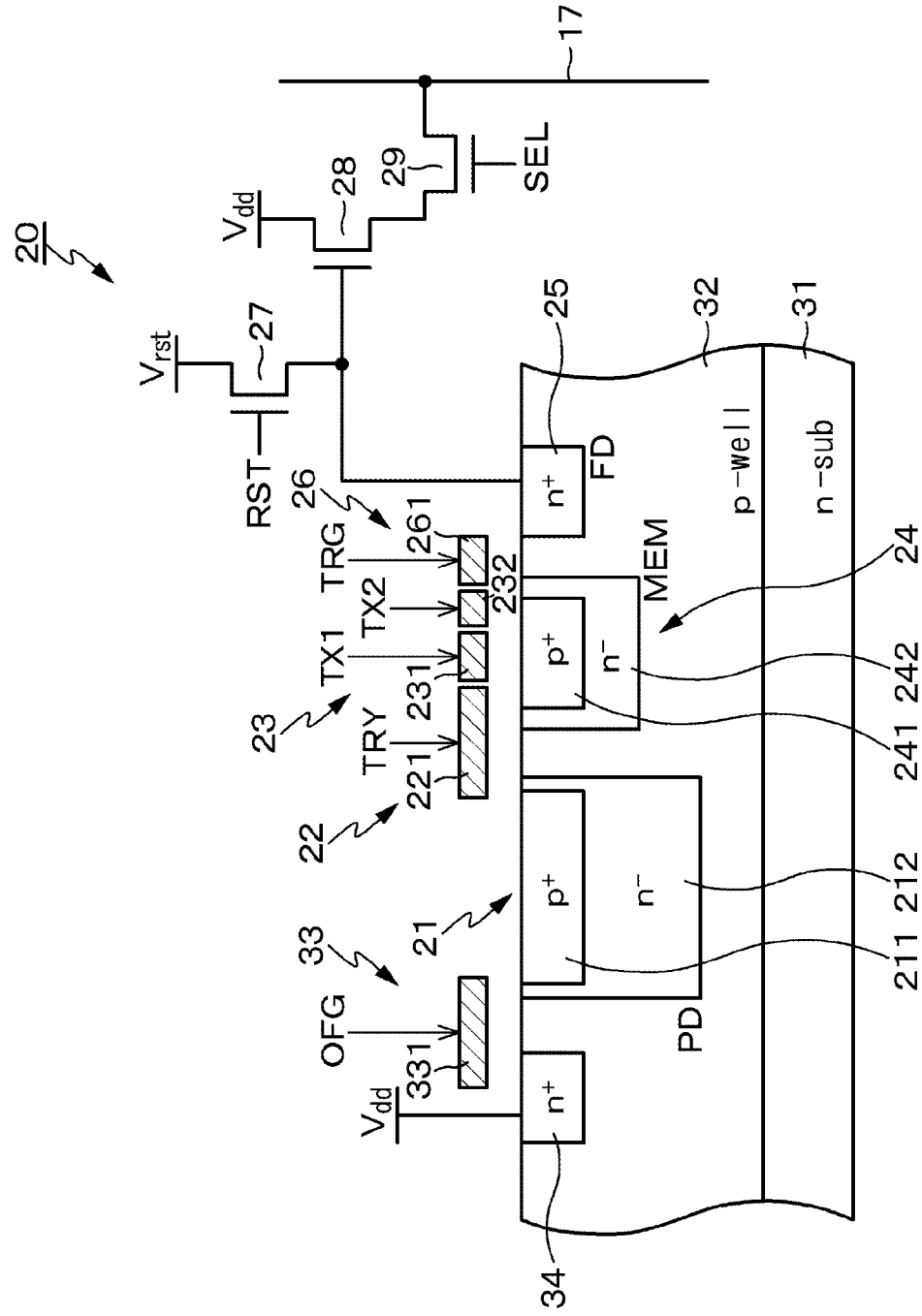
FIG. 2 is a diagram showing an overview of a configuration example of a unit pixel.

FIG. 2 is a diagram showing an overview of a configuration example of the unit pixel 20. The unit pixel 20 includes, for example, a photodiode (PD) 21 as a photoelectric conversion section. The photodiode 21 is, for example, an embedment-type photodiode that is formed by, in a p-type well layer 32 formed on an n-type semiconductor substrate 31, forming a p-type layer 211 on the surface side of the substrate and embedding an n-type embedded layer 212. Note that the impurity concentration of the n-type embedded layer 212 is set such that the n-type embedded layer 212 enters a depletion state when charge is drained.

The unit pixel 20 includes, in addition to the photodiode 21, a first transfer gate section 22, a second transfer gate section 23, and a charge retention section (MEM) 24. The first transfer gate section 22 includes a gate electrode 221 placed in a position straddling the photodiode 21 and the charge retention section 24. The second transfer gate section 23 includes a gate electrode 231 and a gate electrode 232 that are placed in the vicinity of the charge retention section 24.

The unit pixel 20 of the present example employs a configuration in which the charge retention section 24 is formed by using an embedment-type n-type diffusion region 242, with a p-type layer 241 set on the surface. Even in a case where the charge retention section 24 is thus formed by using the n-type diffusion region 242, similar action and effect to those in a case of being formed by using an embedded channel can be obtained. Specifically, a situation where dark current occurring at the Si—SiO₂ interface is accumulated in the n-type diffusion region 242 of the charge retention section 24 can be avoided by forming the n-type diffusion region 242 in the interior of the p-type well layer 32 and forming the p-type layer 241 on the surface side of the substrate; thus, this configuration can contribute to an improvement in image quality.

By a driving signal TRY being applied to the gate electrode 221, the first transfer gate section 22 transfers, to the charge retention section 24, charge that is photoelectrically converted by the photodiode 21 and is accumulated in the interior of the photodiode 21. Further, the first transfer gate section 22 functions as a gate for obstructing backflow of charge from the charge retention section 24 to the photodiode 21.

In the second transfer gate section 23, the gate electrode 221 functions as a gate at the time of transferring charge from the photodiode 21 to the charge retention section 24, and functions as a gate for causing the charge retention section 24 to retain charge. The gate electrode 221 functions as a gate at the time of transferring charge from the charge retention section 24 to a floating diffusion (FD) region 25, and functions as a gate for causing the charge retention section 24 to retain charge. The floating diffusion region 25 is a charge-voltage conversion section including an n-type layer.

In the second transfer gate section 23, modulation is applied to the charge retention section 24 by a driving signal TX1 and a driving signal TX2 being applied to the gate electrode 231 and the gate electrode 232, respectively. That is, the potential of the charge retention section 24 is deepened by a driving signal TX1 and a driving signal TX2 being applied to the gate electrode 231 and the gate electrode 232, respectively. Thereby, the amount of saturation charge of the charge retention section 24 can be made larger than in a case where modulation is not applied.

The unit pixel 20 further includes a third transfer gate section 26. By a driving signal TRG being applied to a gate electrode 261, the third transfer gate section 26 transfers charge accumulated in the charge retention section 24 to the floating diffusion region 25. The floating diffusion region 25 converts charge transferred from the charge retention section 24 by the third transfer gate section 26 to voltage.

The unit pixel 20 further includes a reset transistor 27, an amplification transistor 28, and a selection transistor 29. Note that, although FIG. 2 shows an example in which n-channel MOS transistors are used for the reset transistor 27, the amplification transistor 28, and the selection transistor 29, the combination of the conductivity types of the reset transistor 27, the amplification transistor 28, and the selection transistor 29 is not limited to the combination of this example.

The reset transistor 27 is connected between a node of a power supply voltage $V_{rst}$ and the floating diffusion region 25, and resets the floating diffusion region 25 by a driving signal RST being applied to the gate electrode. For the amplification transistor 28, the drain electrode is connected to a node of a power supply voltage $V_{dd}$, and the gate electrode is connected to the floating diffusion region 25; the amplification transistor 28 reads out the voltage of the floating diffusion region 25.

For the selection transistor 29, for example, the drain electrode is connected to the source electrode of the amplification transistor 28, and the source electrode is connected to the vertical signal line 17; by a driving signal SEL being applied to the gate electrode, the selection transistor 29 selects a unit pixel 20 of which a pixel signal is to be read out. Note that also a configuration in which the selection transistor 29 is connected between a node of a power supply voltage $V_{dd}$ and the drain electrode of the amplification transistor 28 may be employed.

In the configuration example of the unit pixel 20 mentioned above, one or more of the reset transistor 27, the amplification transistor 28, and the selection transistor 29 may be omitted depending on the method for reading out a pixel signal.

Further, although an n-type embedded channel is formed in the p-type well layer 32 in the configuration example of the unit pixel 20 of FIG. 2, the opposite conductivity type may be employed. In this case, all the relationships of potential are reversed.

Further, in the unit pixel 20 shown in FIG. 2, also an overflow gate section 33 for blooming prevention is provided. By a driving signal OFG being applied to a gate electrode 331 of the overflow gate section 33 at the time of the start of exposure, the overflow gate section 33 drains charge of the photodiode 21 to an n-type layer 34. A prescribed voltage $V_{dd}$ has been applied to the n-type layer 34.

The CMOS image sensor 10 according to the present embodiment having the unit pixel 20 mentioned above achieves global shutter operation (global exposure) by starting exposure simultaneously for all the pixels, ending the exposure simultaneously for all the pixels, and transferring charge accumulated in the photodiode 21 to the charge retention section 24 that is shielded from light. By the global shutter operation, imaging without distortion based on an exposure period in agreement for all the pixels can be achieved.

[Light Blocking Structure of CMOS Image Sensor]

The CMOS image sensor 10 according to the present embodiment of the configuration mentioned above has a light blocking structure that suppresses the incidence of light on the charge retention section 24. Hereinbelow, specific Examples of the light blocking structure of the CMOS image sensor 10 are described.

Example 1

Figure 3:
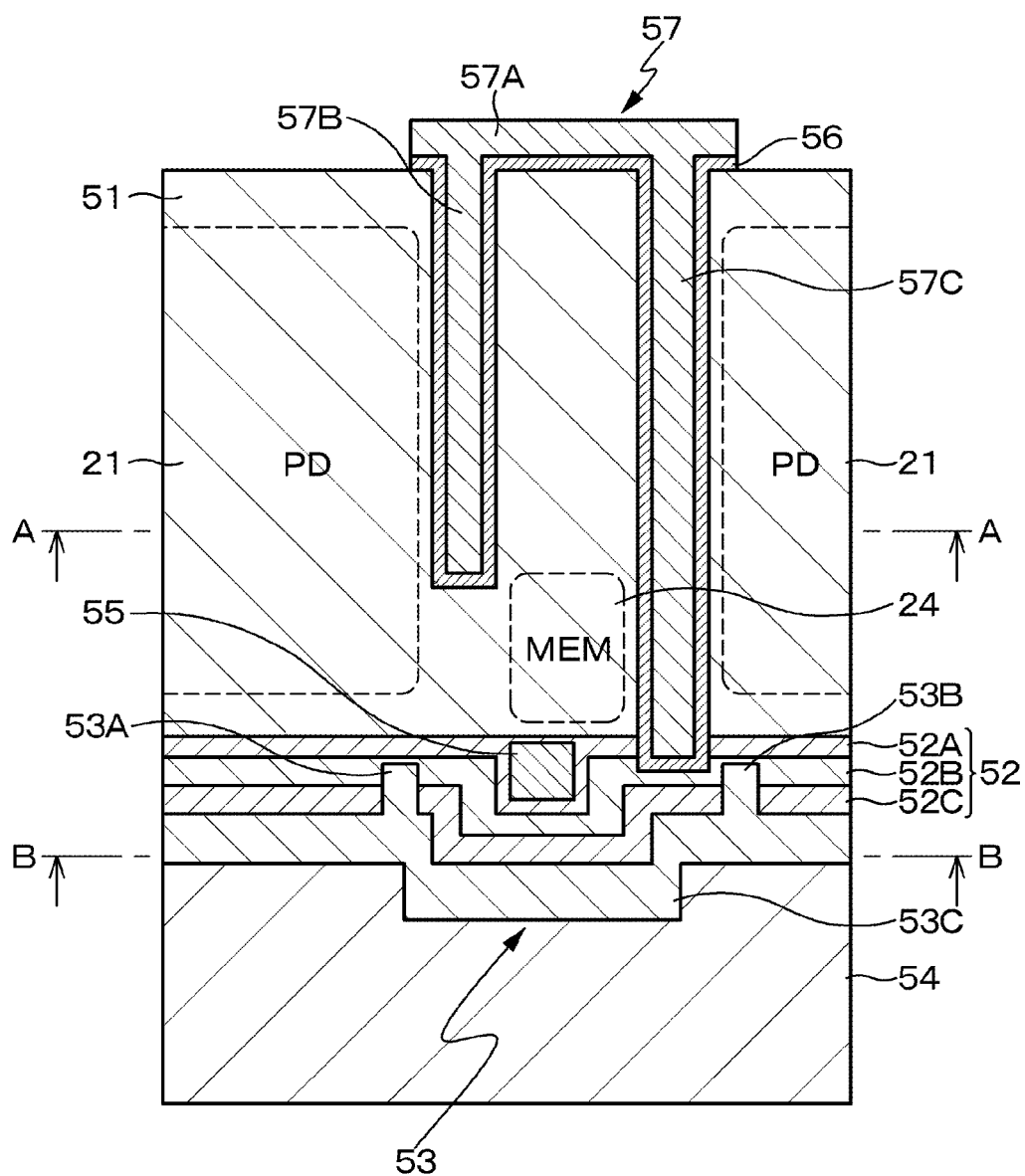
FIG. 3 is a cross-sectional view schematically showing a CMOS image sensor having a light blocking structure according to Example 1 of a first embodiment.

Example 1 is an example of a basic structure of a light blocking structure of the CMOS image sensor 10 according to the present embodiment. FIG. 3 is a cross-sectional view schematically showing a basic structure of a light blocking structure according to Example 1.

As shown in FIG. 3, the CMOS image sensor 10 has a configuration in which a semiconductor substrate 51, an insulating film layer 52, a first light blocking film 53, and a wiring layer 54 are stacked in this order from the upper side of the drawing. The CMOS image sensor 10 is a back-side illumination imaging element in which light applied from, of the semiconductor substrate 51, the back face side on the opposite side to the front face side on which the wiring layer 54 is stacked is taken into the photodiode 21.

That is, the CMOS image sensor 10 has a configuration in which the insulating film layer 52, the first light blocking film 53, and the wiring layer 54 are stacked on, of the semiconductor substrate 51, a second face (a front face) on the opposite side to a first face (a back face) on which light is incident, in this order from the side near to the second face. Further, the CMOS image sensor 10 has a configuration in which a second light blocking film 57 is formed on the incident face of the semiconductor substrate 51 and between the photodiode 21 and the charge retention section 24 via a multiple-layer film 56. The multiple-layer film 56 includes, for example, a film of a three-layer structure including a fixed charge film, an anti-reflection film, and an insulating film. The insulating film includes, for example, an oxide film such as a $SiO_2$ film.

Note that, although the illustration is omitted, for example, a passivation film, a color filter, microlenses, etc. are stacked on the back face side of the semiconductor substrate 51. Further, for example, a support substrate is stacked under the wiring layer 54.

Hereinbelow, the back face of the semiconductor substrate 51 may be referred to as an incident face. Further, a face of the semiconductor substrate 51 that is the front face and is placed at the boundary with the wiring layer 54 is referred to as a boundary face. Further, a face of the photodiode 21 on the incident face side of the semiconductor substrate 51 is referred to as a light receiving face, and a face on the opposite side to the light receiving face is referred to as a bottom face. Further, a face of the charge retention section 24 on the incident face side of the semiconductor substrate 51 is referred to as an upper face, and a face on the opposite side to the upper face is referred to as a bottom face.

The semiconductor substrate 51 includes, for example, a silicon substrate. The photodiode 21 and the charge retention section 24 are formed in the semiconductor substrate 51. Note that the photodiode 21 on the left side and the charge retention section 24 in the drawing are arranged in the same pixel 20, and the photodiode 21 on the right side and the charge retention section 24 are arranged in adjacent different pixels 20.

The insulating film layer 52 includes, for example, an insulating film of three layers of a first insulating film 52A, a second insulating film 52B, and a third insulating film 52C (a three-layer structure). Each of the first insulating film 52A and the third insulating film 52C includes, for example, an oxide film such as a $SiO_2$ film, and the second insulating film 52B includes, for example, a nitride film such as a SiN film. The first insulating film 52A serves also as an insulating film between a gate electrode 55 and the semiconductor substrate 51. Note that the gate electrode 55 corresponds to, for example, the gate electrode 221 of the first transfer gate section 22 of FIG. 2.

(With Regard to First Light Blocking Film)

The first light blocking film 53 contains, for example, a metal having light blocking properties, such as tungsten. The first light blocking film 53 is provided on the wiring layer 54 side so as to cover at least the formation region of the charge retention section 24, preferably so as to cover the formation regions of the photodiode 21 and the charge retention section 24. The first light blocking film 53 is provided for the purpose of preventing a situation where light that is not absorbed by the photodiode 21 but is transmitted through the semiconductor substrate 51 is incident on the wiring layer 54. By the action of the first light blocking film 53, a situation where light transmitted through the semiconductor substrate 51 is incident on the wiring layer 54, is reflected at the wiring layer 54, and is incident on the charge retention section 24 is suppressed.

Here, it is possible that light transmitted through the semiconductor substrate 51 will be reflected at a face parallel to the semiconductor substrate 51 of a flat section 53C, which is a main body section of the first light blocking film 53, and will be incident on the charge retention section 24. Thus, the first light blocking film 53 has, in a part corresponding to the formation position of the second light blocking film 57, a protrusion section protruding from the flat section 53C toward the semiconductor substrate 51 side. More specifically, the first light blocking film 53 has a protrusion section 53A and a protrusion section 53B in a part corresponding to the formation position of at least one of, preferably both of a not-piercing light blocking section 57B and a piercing light blocking section 57C described later of the second light blocking film 57. The protrusion section 53A and the protrusion section 53B are formed integrally with the flat section 53C of the first light blocking film 53 by using a metal having light blocking properties, such as tungsten.

The protrusion section 53A and the protrusion section 53B are formed along the longitudinal direction of the charge retention section 24, in parts more on the sides of the photodiodes 21 than immediately below the formation positions of the not-piercing light blocking section 57B and the piercing light blocking section 57C of the second light blocking film 57. That is, the protrusion section 53A is provided in a part more on the side of the photodiode 21 in the same pixel than immediately below the formation position of the not-piercing light blocking section 57B, in a state of protruding from the flat section 53C toward the semiconductor substrate 51 side. Further, the protrusion section 53B is provided in a part more on the side of the photodiode 21 in an adjacent pixel than immediately below the formation position of the piercing light blocking section 57C, in a state of protruding from the flat section 53C toward the semiconductor substrate 51 side.

The protrusion section 53A and the protrusion section 53B have the action of preventing reflection at the upper face of the flat section 53C of the first light blocking film 53 and incidence on the charge retention section 24. In terms of obstructing a situation where light reflected at the flat section 53C of the first light blocking film 53 is incident on the charge retention section 24, the amount of protrusion, that is, the height of the protrusion section 53A and the protrusion section 53B is preferably as high as possible. Conversely, if the height of the protrusion section 53A and the protrusion section 53B is too high, this may be a factor of the worsening of characteristics, such as white spots due to the influence of plasma damage etc. during the processing of the protrusion section 53A and the protrusion section 53B.

From such a point of view, the height position of the protrusion section 53A and the protrusion section 53B is, as shown in FIG. 3, preferably set in the second insulating film 52B including a nitride film such as a SiN film, which is an intermediate layer in the insulating film layer 52 of a three-layer structure. However, although the height position of the protrusion section 53A and the protrusion section 53B is preferably set in the second insulating film 52B, which is an intermediate layer, the height position is not limited to this, and may be set in the first insulating film 52A of the first layer or may be set in the third insulating film 52C of the third layer.

(With Regard to Second Light Blocking Film)

The second light blocking film 57 contains, for example, a metal having light blocking properties, such as tungsten. The second light blocking film 57 suppresses mainly a situation where light incident from the incident face of the semiconductor substrate 51 is directly or indirectly incident on the charge retention section 24. The second light blocking film 57 includes a surface light blocking section 57A, the not-piercing light blocking section 57B, and the piercing light blocking section 57C.

The surface light blocking section 57A is a third light blocking section, and covers a region of the incident face of the semiconductor substrate 51 excluding above the light receiving face of the photodiode 21. That is, the surface light blocking section 57A covers a region of the light receiving face of the semiconductor substrate 51 excluding a region where light toward the photodiode 21 is incident.

The not-piercing light blocking section 57B is a first light blocking section, and extends from the incident face of the semiconductor substrate 51 up to partway through the semiconductor substrate 51. Further, in this example, the not-piercing light blocking section 57B is placed at least between the photodiode 21 and the charge retention section 24 in the same pixel 20.

The piercing light blocking section 57C is a second light blocking section, and pierces the semiconductor substrate 51 and extends up to partway through the insulating film layer 52, in the present example pierces the first insulating film 52A and extends up to the second insulating film 52B. That is, the piercing light blocking section 57C extends longer than the not-piercing light blocking section 57B. Further, in this example, the piercing light blocking section 57C is placed between the photodiode 21 and the charge retention section 24 arranged in mutually different pixels 20. That is, the piercing light blocking section 57C is placed at least between the photodiode 21 of one pixel 20 and the charge retention section 24 of the other pixel 20 of mutually adjacent pixels 20.

The not-piercing light blocking section 57B, which is the first light blocking section, and the piercing light blocking section 57C, which is the second light blocking section, are linked via the surface light blocking section 57A, which is the third light blocking section, in a direction parallel to the incident face (the first face) of the semiconductor substrate 51. Further, the side face of the photodiode 21 is surrounded by the not-piercing light blocking section 57B and the piercing light blocking section 57C.

(With Regard to Thicknesses of Insulating Films of Insulating Film Layer)

Here, examples of the thicknesses of the first insulating film 52A, the second insulating film 52B, and the third insulating film 52C of the insulating film layer 52 are described.

The thickness of the first insulating film 52A is set to, for example, more than or equal to 10 nm. This is, for example, a thickness necessary to make the processing adjustment of the depth of a trench that is for forming the piercing light blocking section 57C and pierces the semiconductor substrate 51. However, the first insulating film 52A serves also as an insulating film between the gate electrode 55 and the semiconductor substrate 51; thus, it is not very desirable to set the first insulating film 52A too thick. Therefore, the thickness of the first insulating film 52A is preferably set, for example, within the range of 10 nm to 20 nm.

The thickness of the second insulating film 52B is set to, for example, more than or equal to 50 nm. This is, for example, a thickness necessary for the processing adjustment of contacts formed in the wiring layer 54 and the processing control of a trench that is for forming the piercing light blocking section 57C and pierces the semiconductor substrate 51. For example, the thickness is a thickness necessary for trenches for forming contacts to reach the semiconductor substrate 51, for the semiconductor substrate 51 to be prevented from being damaged by damage due to the processing of contacts, and for a trench that is for forming the piercing light blocking section 57C and pierces the semiconductor substrate 51 to be stopped in the second insulating film 52B. However, from the viewpoints of the thickness reduction etc. of the CMOS image sensor 10, it is not very desirable to set the second insulating film 52B too thick. Therefore, the thickness of the second insulating film 52B is preferably set, for example, within the range of 50 nm to 100 nm.

The thickness of the third insulating film 52C is set to, for example, more than or equal to 25 nm. This is, for example, a thickness necessary to prevent a situation where the third insulating film 52C is damaged and the second insulating film 52B is exposed during the processing of the first light blocking film 53. However, from the viewpoints of the thickness reduction etc. of the CMOS image sensor 10, it is not very desirable to set the third insulating film 52C too thick. Therefore, the thickness of the third insulating film 52C is preferably set, for example, within the range of 30 nm to 100 nm.

Figure 4:
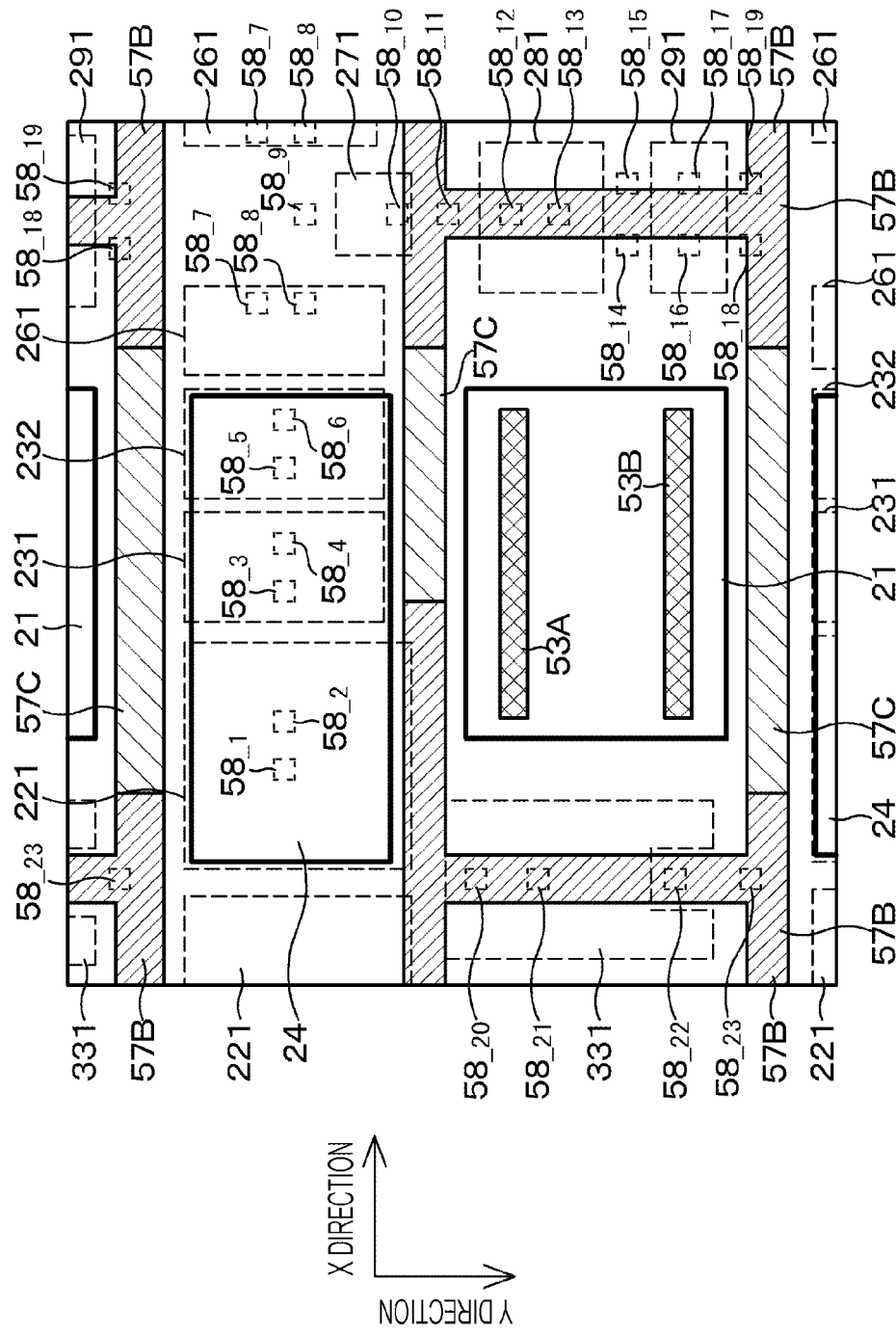
FIG. 4 is a cross-sectional view schematically showing a planar layout of a cross section taken along line A-A of the CMOS image sensor of FIG. 3 as seen in the direction of the arrows.

FIG. 4 is a cross-sectional view schematically showing a planar layout of a cross section taken along line A-A of the CMOS image sensor 10 of FIG. 3 as seen in the direction of the arrows. Note that, in FIG. 4, in order to distinguish between the not-piercing light blocking section 57B and the piercing light blocking section 57C, the not-piercing light blocking section 57B is shown by a pattern of oblique lines extending in an obliquely right lower direction and having narrow intervals, and the piercing light blocking section 57C is shown by a pattern of oblique lines extending in an obliquely left lower direction and having wide intervals.

Further, the positions of the gate electrode 221 of the first transfer gate section 22, the gate electrodes 231 and 232 of the second transfer gate section 23, the gate electrode 261 of the third transfer gate section 26, and the gate electrode 331 of the overflow gate section 33, which are formed on the boundary face side of the semiconductor substrate 51, are shown by dotted lines. Similarly, the positions of a gate electrode 271 of the reset transistor 27, a gate electrode 281 of the amplification transistor 28, and a gate electrode 291 of the selection transistor 29 are shown by dotted lines. Further, the positions of contact $58_{-1}$ to contact $58_{-23}$ formed in the wiring layer 54 are shown by dotted lines.

Note that, hereinbelow, in a case where the positional relationships between sections in the unit pixel 20 are described, a description is given using the left-right direction (hereinafter, occasionally written as an "X direction") and the up-down direction (hereinafter, occasionally written as a "Y direction") in FIG. 4.

Further, in FIG. 4, one pixel 20 is shown at the center, and parts of the surrounding pixels 20 are shown. Then, corresponding portions of the pixels 20 are marked with the same reference sign. Note that the arrangements of the sections in pixels 20 adjacent in the X direction are mutually left-right symmetric. Further, the arrangements of the sections in pixels 20 adjacent in the Y direction are similar.

In FIG. 4, the protrusion section 53A and the protrusion section 53B of the first light blocking film 53 are shown by shaded patterns. As shown in FIG. 4, the protrusion section 53A and the protrusion section 53B of the first light blocking film 53 are formed mutually parallel along the longitudinal direction of the charge retention section 24, that is, the X direction.

On the photodiode 21, the gate electrode 221 of the first transfer gate section 22, the gate electrodes 231 and 232 of the second transfer gate section 23, and the gate electrode 261 of the third transfer gate section 26 are arranged so as to be aligned from left to right of the drawing in the X direction. Contact $58_{-1}$ and contact $58_{-2}$ are arranged substantially at the center of the gate electrode 221 so as to be aligned in the left-right direction. Contact $58_{-3}$ and contact $58_{-4}$ are arranged almost at the center of the gate electrode 231 so as to be aligned in the left-right direction. Contact $58_{-5}$ and contact $58_{-6}$ are arranged almost at the center of the gate electrode 232 so as to be aligned in the left-right direction. Contact $58_{-1}$ to contact $58_{-6}$ are aligned in a line in the X direction. Contact $58_{-7}$ and contact $58_{-8}$ are arranged at the right end of the gate electrode 261 so as to be aligned in the Y direction.

Further, the charge retention section 24 is placed so as to be almost superimposed with the gate electrode 221, the gate electrode 231, and the gate electrode 232.

The gate electrode 271 of the reset transistor 27, the gate electrode 281 of the amplification transistor 28, and the gate electrode 291 of the selection transistor 29 are arranged on the right side of the photodiode 21 so as to be aligned in the up-down direction. Contact $58_{-9}$ is placed on the upper side of the drawing of the gate electrode 271. Contact $58_{-10}$ is placed at the lower end of the gate electrode 271. Contact $58_{-11}$ is placed between the gate electrode 271 and the gate electrode 281. Contact $58_{-12}$ and contact $58_{-13}$ are arranged substantially at the center of the gate electrode 281 so as to be aligned in the up-down direction. Contact $58_{-9}$ to contact $58_{-13}$ are aligned in a line in the Y direction.

Contact $58_{-14}$ and contact $58_{-15}$ are arranged between the gate electrode 281 and the gate electrode 291 so as to be aligned in the left-right direction. Contact $58_{-16}$ and contact $58_{-17}$ are arranged almost at the center of the gate electrode 291 so as to be aligned in the left-right direction. Contact $58_{-18}$ and contact $58_{-19}$ are arranged on the lower side of the drawing of the gate electrode 291 so as to be aligned in the left-right direction. Contact $58_{-14}$, contact $58_{-16}$, and contact $58_{-18}$ are aligned in a line in the Y direction. Contact $58_{-15}$, contact $58_{-17}$, and contact $58_{-19}$ are aligned in a line in the Y direction.

The gate electrode 331 of the overflow gate section 33 is placed on the left side of the photodiode 21. Contact $58_{-20}$ and contact $58_{-21}$ are arranged on the upper side in the gate electrode 331 so as to be aligned in the up-down direction. Contact $58_{-22}$ is placed in a depressed portion at the lower end of the gate electrode 331. Contact $58_{-23}$ is placed on the lower side of the drawing of the gate electrode 331. Contact $58_{-20}$ to contact $58_{-23}$ are aligned in a line in the Y direction.

The circumference (side face) of the photodiode 21 is surrounded by the not-piercing light blocking section 57B and the piercing light blocking section 57C. The not-piercing light blocking section 57B and the piercing light blocking section 57C are linked without a break in a direction parallel to the incident face of the semiconductor substrate 51, and surround the circumference (side face) of the photodiode 21 without a break. Further, the not-piercing light blocking section 57B continues without a break also between pixels 20 adjacent in the left-right direction.

Out of the light blocking sections surrounding the photodiode 21, the piercing light blocking section 57C is placed between the photodiode 21, and the gate electrode 231 and the gate electrode 232 in the same pixel 20 as the pixel of the photodiode 21 mentioned above. Further, the piercing light blocking section 57C is placed between the photodiode 21 and the charge retention section 24 of a pixel 20 adjacent in the up-down direction.

The not-piercing light blocking section 57B is placed in the other portion. Specifically, the not-piercing light blocking section 57B is placed between the photodiode 21 and a pixel 20 adjacent in the left-right direction. This is in order to form the gate electrodes of transistors (27 to 29) and contacts. Further, the not-piercing light blocking section 57B is placed between the photodiode 21 and the gate electrode 221 of the first transfer gate section 22 in the same pixel. This is in order to ensure a path through which charge flows from the photodiode 21 to the charge retention section 24. Further, the not-piercing light blocking section 57B is placed in a connection section between the second light blocking film 57 extending in the X direction and the second light blocking film 57 extending in the Y direction (a portion where the second light blocking films 57 cross). This is because, if the piercing light blocking section 57C is formed in this portion, there is a fear that etching will be accelerated due to a micro-loading phenomenon and the piercing light blocking section 57C will reach the wiring layer 54.

Note that, for a reason described later, the width in a direction parallel to the incident face of the semiconductor substrate 51 of the piercing light blocking section 57C is wider than that of the not-piercing light blocking section 57B.

Figure 5:
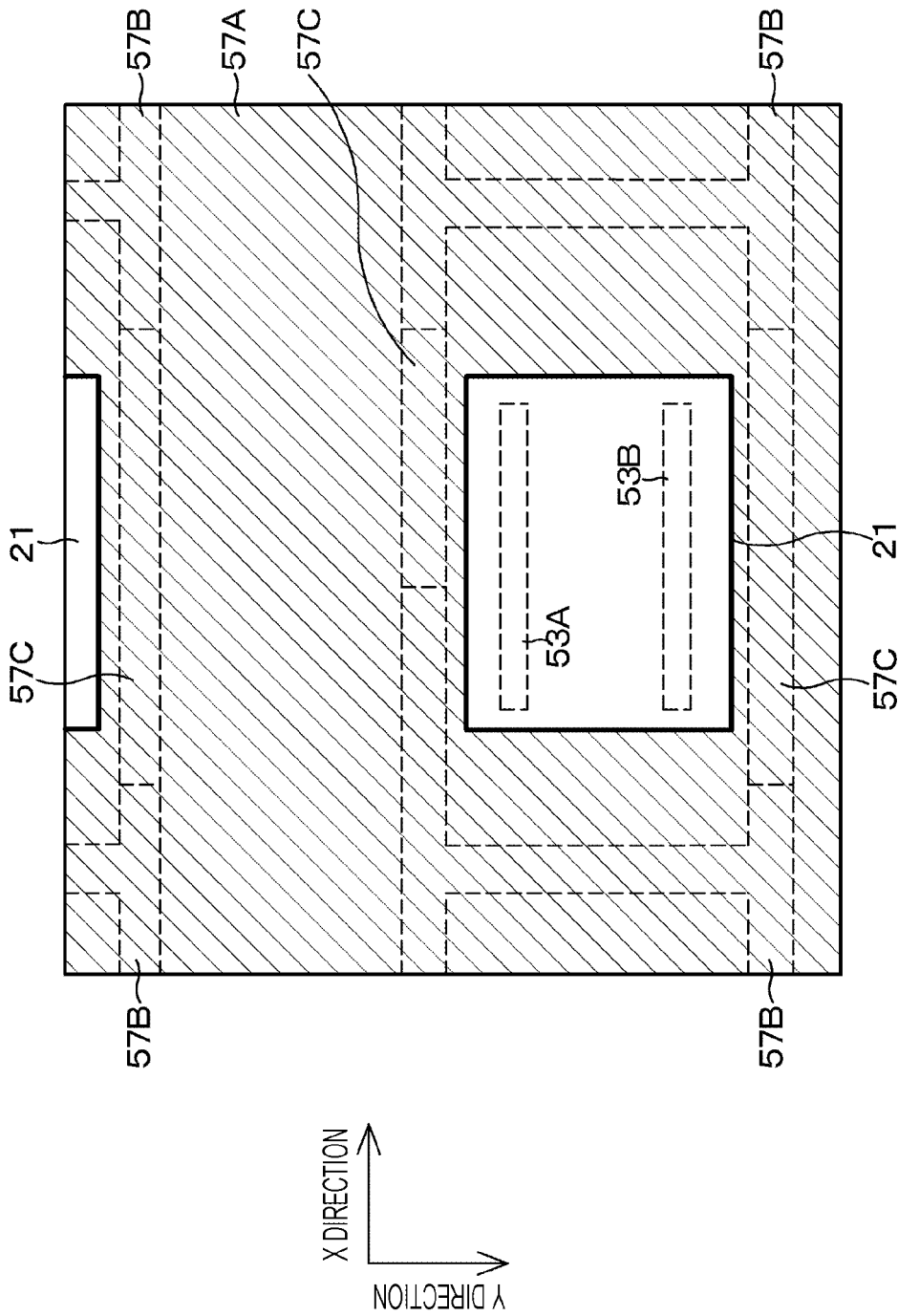
FIG. 5 is a diagram schematically showing a planar layout of an incident face of a semiconductor substrate of the CMOS image sensor, in the same position in the arrangement direction of pixels as the cross-sectional view of FIG. 4.

FIG. 5 is a diagram schematically showing a planar layout of the incident face of the semiconductor substrate 51 of the CMOS image sensor 10 shown in FIG. 3, in the same position in the arrangement direction of pixels as the cross-sectional view of FIG. 4. Note that the portion shown by the oblique lines in the drawing indicates a region where the planar light blocking section 57A is placed. Further, in FIG. 5, the positions of the not-piercing light blocking section 57B and the piercing light blocking section 57C are shown by dotted lines.

As shown in FIG. 5, the surface light blocking section 57A covers regions of the incident face of the semiconductor substrate 51 excluding the light receiving face of the photodiode 21.

Figure 6:
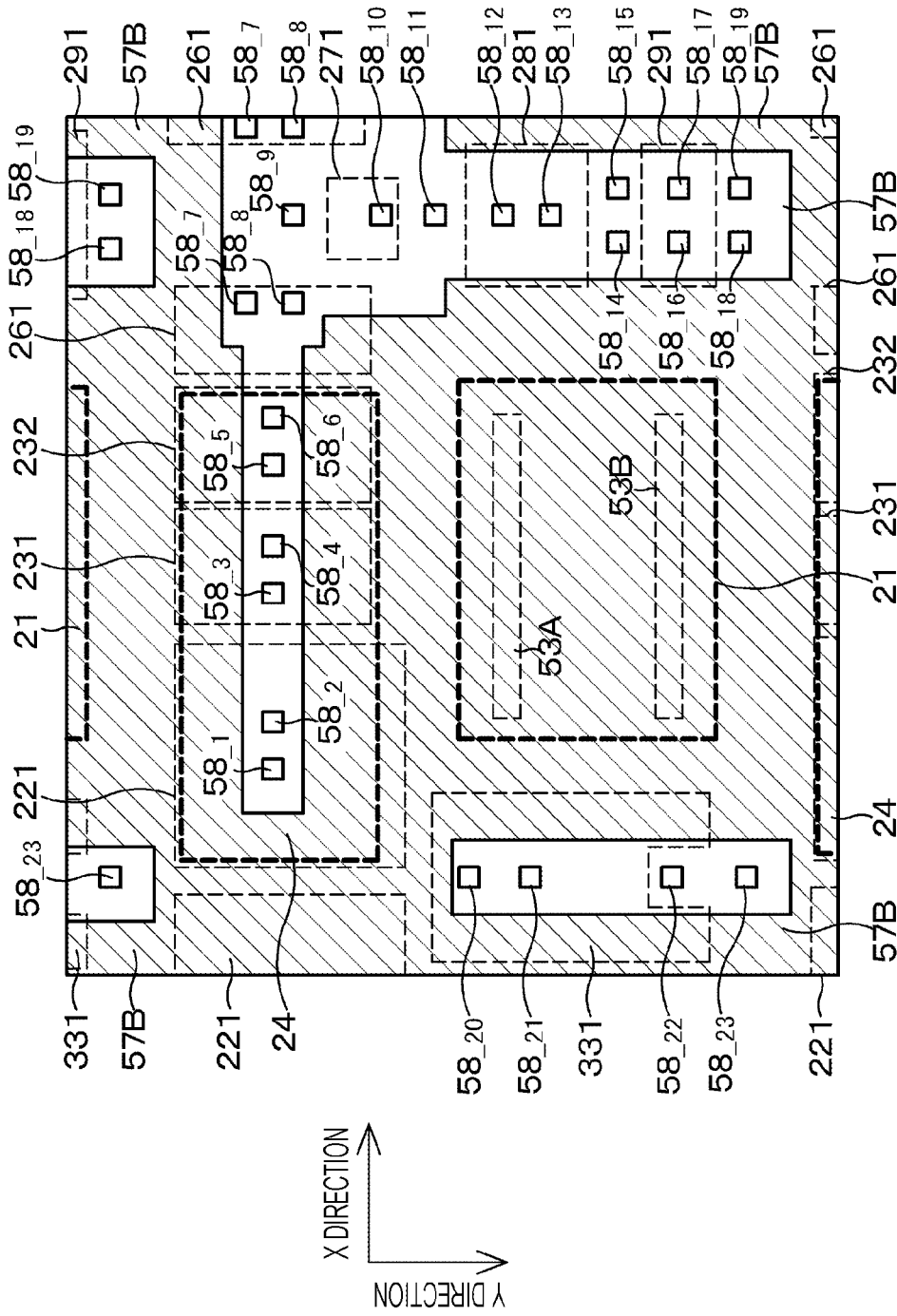
FIG. 6 is a cross-sectional view schematically showing a planar layout of a cross section taken along line B-B of the CMOS image sensor of FIG. 3 as seen in the direction of the arrows, in the same position in the arrangement direction of pixels as the cross-sectional view of FIG. 4.

FIG. 6 is a cross-sectional view schematically showing a planar layout of a cross section taken along line B-B of the CMOS image sensor 10 of FIG. 3 as seen in the direction of the arrows, in the same position in the arrangement direction of pixels as the cross-sectional view of FIG. 4. Note that the portion shown by the oblique lines in the drawing indicates a region where the first light blocking film 53 is placed.

In FIG. 6, the positions of the photodiode 21, the gate electrode 221 of the first transfer gate section 22, the gate electrodes 231 and 232 of the transfer gate section 23, the charge retention section 24, and the gate electrode 261 of the third transfer gate section 26 are shown by dotted lines. Similarly, the positions of the gate electrode 271 of the reset transistor 27, the gate electrode 281 of the amplification transistor 28, and the gate electrode 291 of the selection transistor 29 are shown by dotted lines.

The first light blocking film 53 is placed in regions excluding active regions of the boundary face of the semiconductor substrate 51 and regions where contact $58_{-1}$ to contact $58_{-23}$ are arranged. Therefore, the entire bottom face of the photodiode 21 is covered with the first light blocking film 53. Further, the bottom face of the charge retention section 24 is almost covered with the first light blocking film 53, excluding active regions of the boundary face of the semiconductor substrate 51 and regions where contact $58_{-1}$ to contact $58_{-6}$ are arranged.

As described above, in the CMOS image sensor 10 having the light blocking structure according to Example 1, regions of the incident face of the semiconductor substrate 51 excluding the region where light toward the photodiode 21 is incident are covered with the surface light blocking section 57A. Therefore, light incident on the incident face of the semiconductor substrate 51 is hardly incident on regions other than the light receiving face of the photodiode 21. Further, a situation where light transmitted through the photodiode 21 is incident on the charge retention section 24 is suppressed by the not-piercing light blocking section 57B and the piercing light blocking section 57C surrounding the side face of the photodiode 21.

Furthermore, the light blocking region can be set large by the piercing light blocking section 57C being provided to pierce the semiconductor substrate 51, and therefore the incidence of light on the charge retention section 24 can be suppressed more surely. Further, a situation where light transmitted through the photodiode 21 is incident on the wiring layer 54 is prevented by the first light blocking film 53, and therefore a situation where reflected light from the wiring of the wiring layer 54 is incident on the charge retention section 24 is prevented. Thereby, the occurrence of optical noise due to a situation where light is incident on the charge retention section 24 is suppressed; for example, light leakage noise of a global shutter can be suppressed.

Further, by applying a negative bias to the piercing light blocking section 57C, pinning is strengthened, and the occurrence of dark current is suppressed. Then, by the occurrence of dark current being suppressed, the p-type well layer 53 of the semiconductor substrate 51 is allowed to have low concentration. Thereby, the surface charge density Qs of the semiconductor substrate 51 and the capacity of the charge retention section 24 can be increased, and therefore pixel characteristics can be improved.

In particular, in the light blocking structure according to Example 1, the protrusion section 53A and the protrusion section 53B are provided in a state of protruding into the insulating film layer 52 in parts of the first light blocking film 53 more on the sides of the photodiodes 21 than the parts corresponding to the formation positions of the second light blocking film 57, more specifically, than immediately below the formation positions of the not-piercing light blocking section 57B and the piercing light blocking section 57C.

Figure 7:
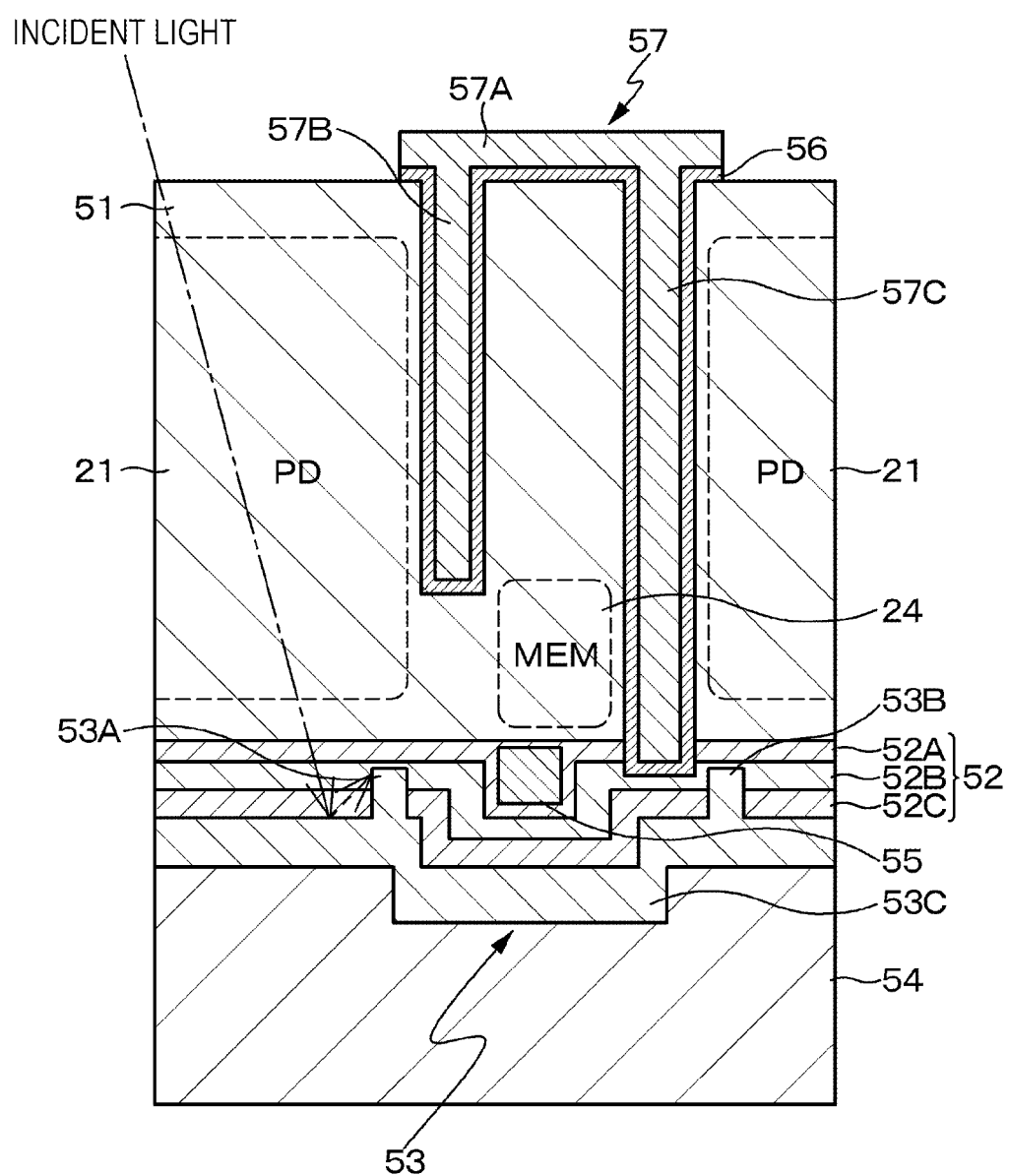
FIG. 7 is a diagram describing a light blocking function of a light blocking structure according to Example 1.

By this light blocking structure according to Example 1, a situation where light that is not absorbed by the photodiode 21 but is transmitted through the semiconductor substrate 51, and is reflected at the upper face of the flat section 53C of the first light blocking film 53 is incident on the charge retention section 24 is obstructed by the protrusion section 53A and the protrusion section 53B, as shown in FIG. 7. Thereby, the occurrence of optical noise caused by a situation where light reflected at the flat face section of the first light blocking film 53 is incident on the charge retention section 24 is suppressed, and therefore light leakage noise can be improved more surely.

Figure 8:
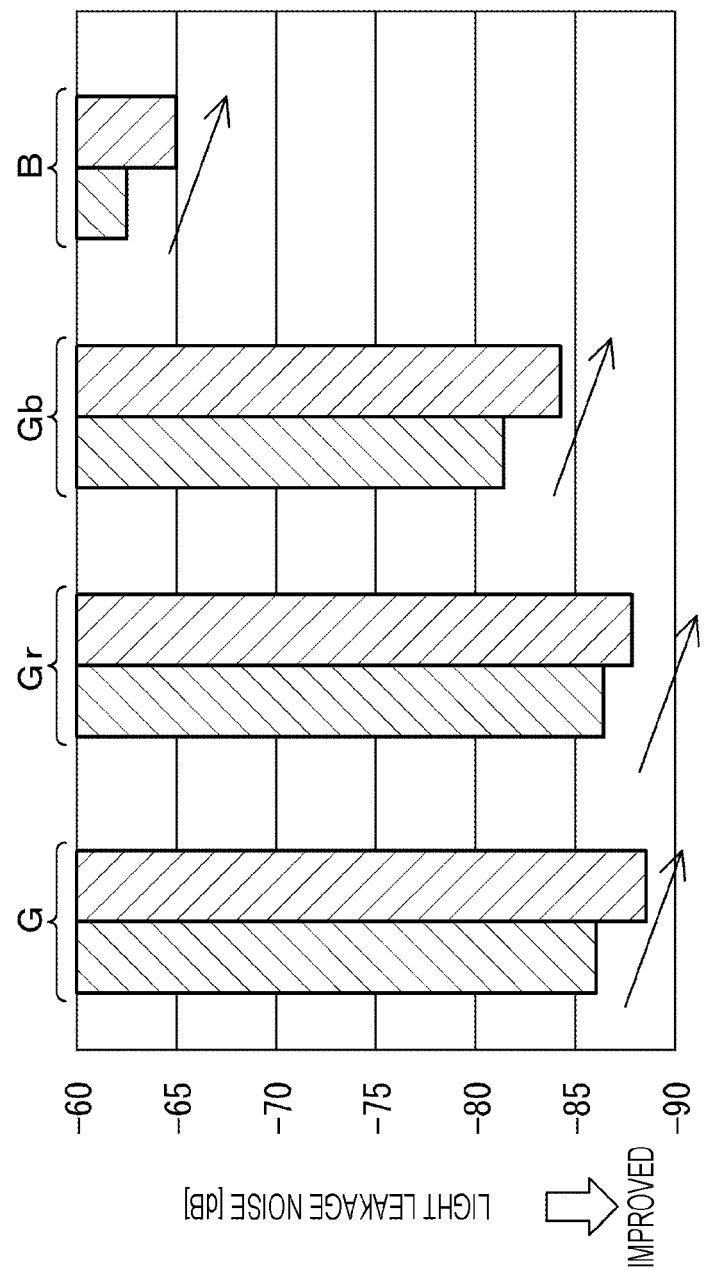
FIG. 8 is a diagram showing a simulation result regarding light leakage noise in a light blocking structure according to Example 1.
Figure 9:
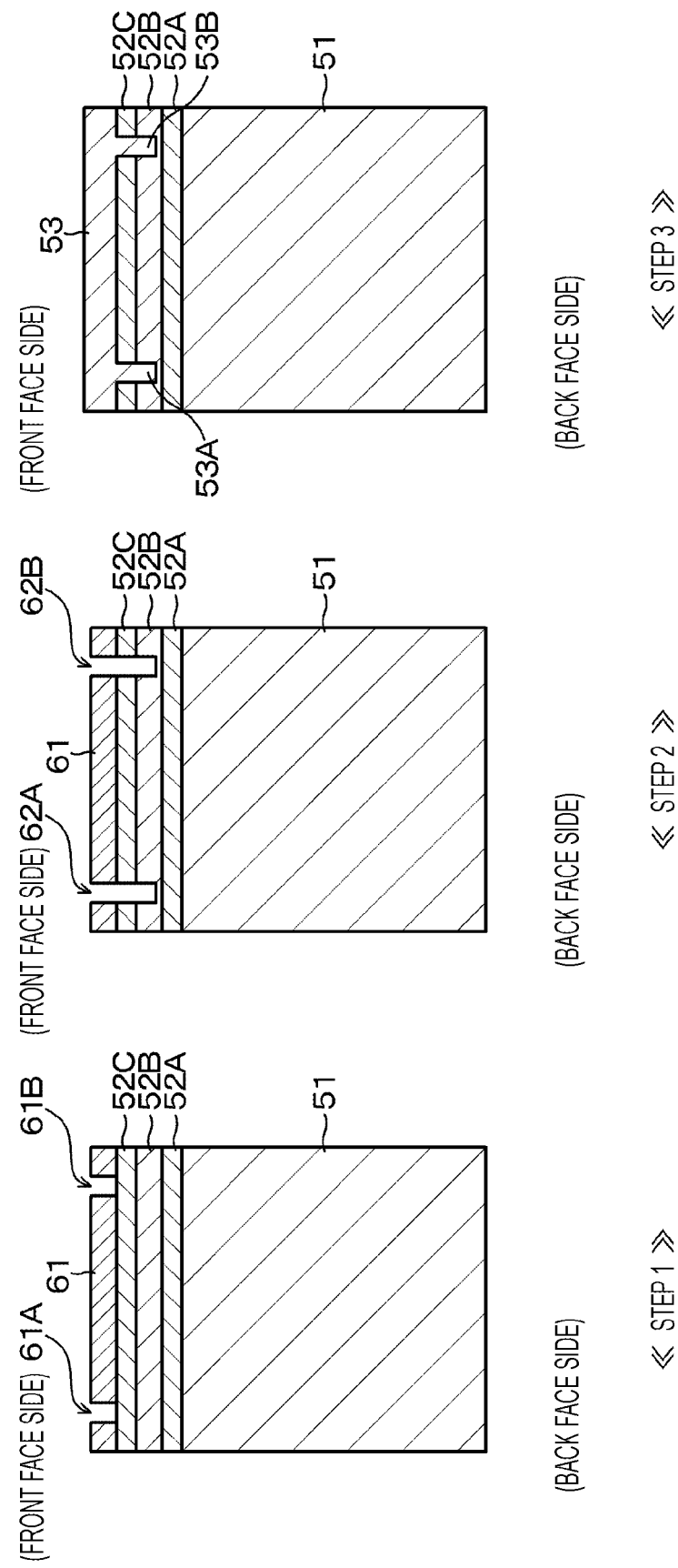
FIG. 9 is a step diagram (part 1) for describing a method for manufacturing a CMOS image sensor according to Example 2.
Figure 10:
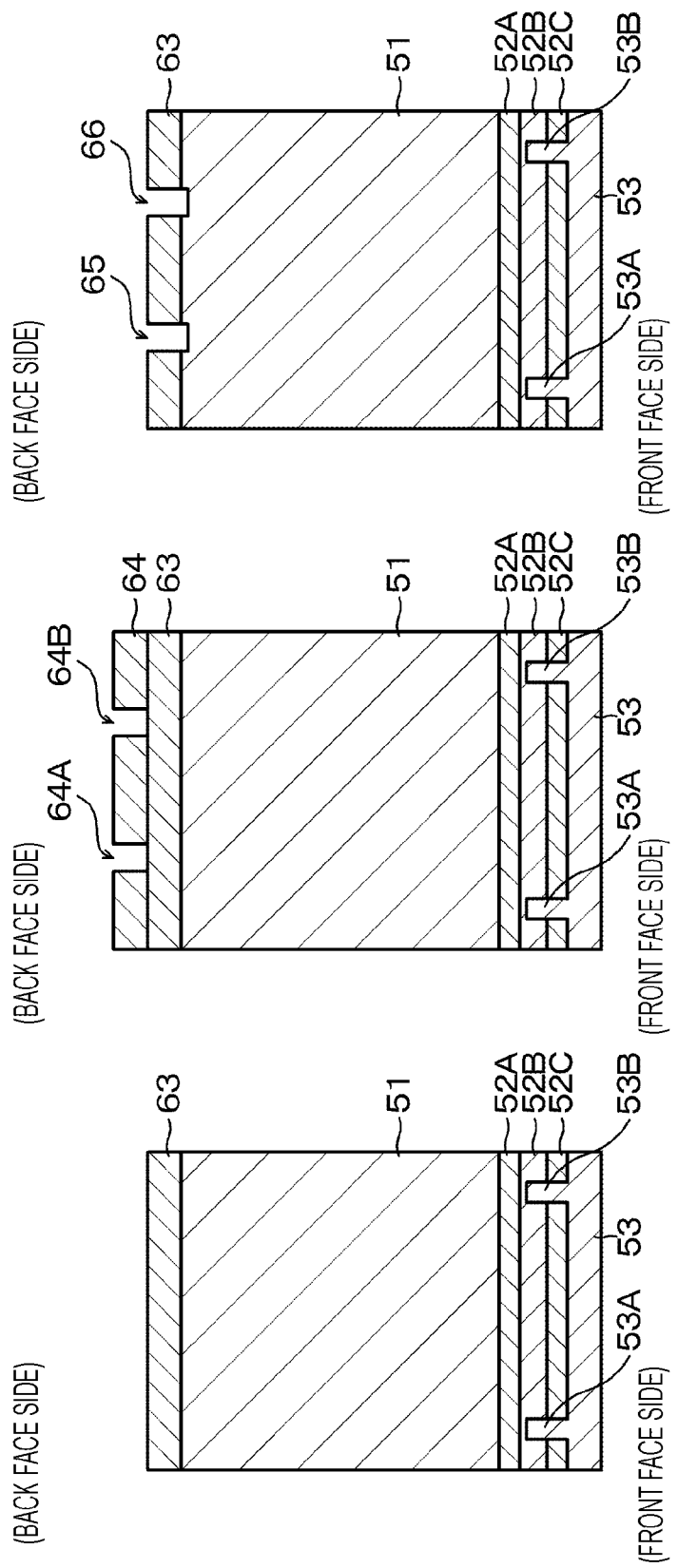
FIG. 10 is a step diagram (part 2) for describing a method for manufacturing a CMOS image sensor according to Example 2.
Figure 11:
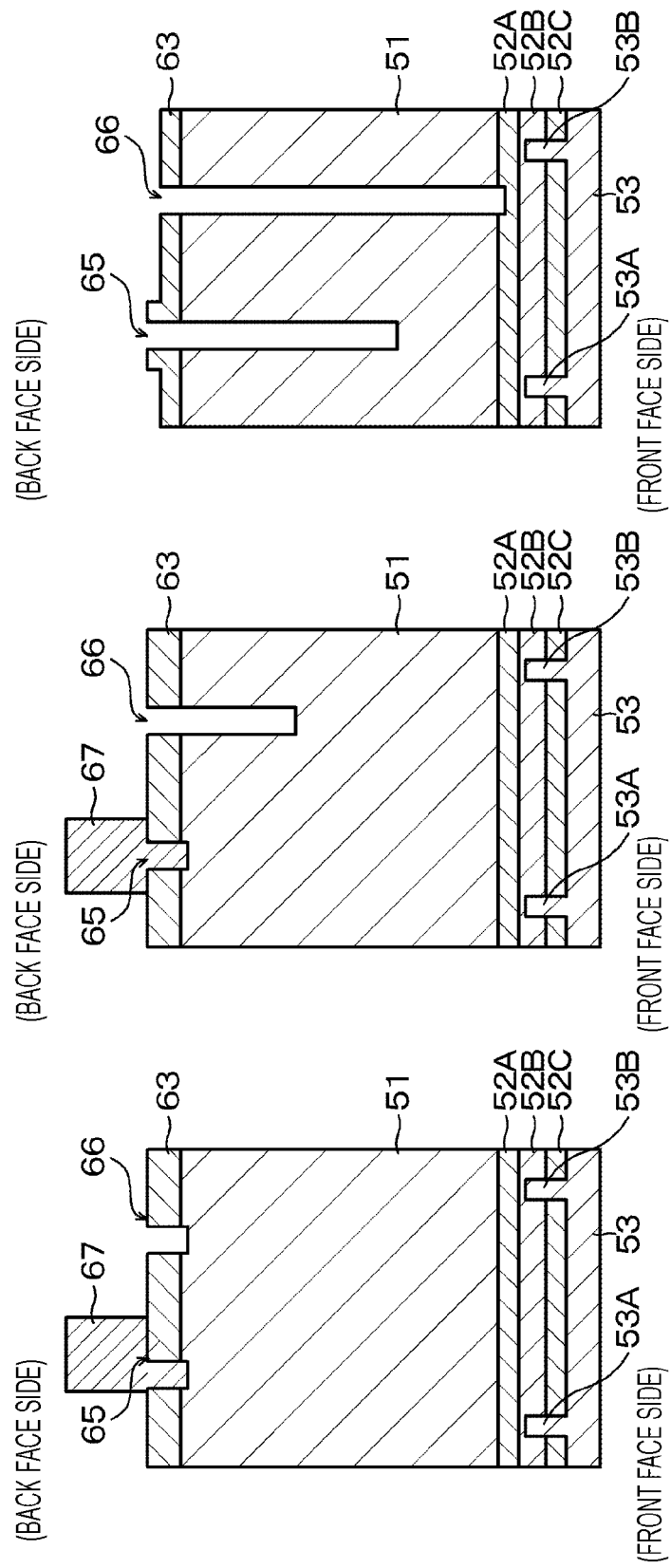
FIG. 11 is a step diagram (part 3) for describing a method for manufacturing a CMOS image sensor according to Example 2.
Figure 12:
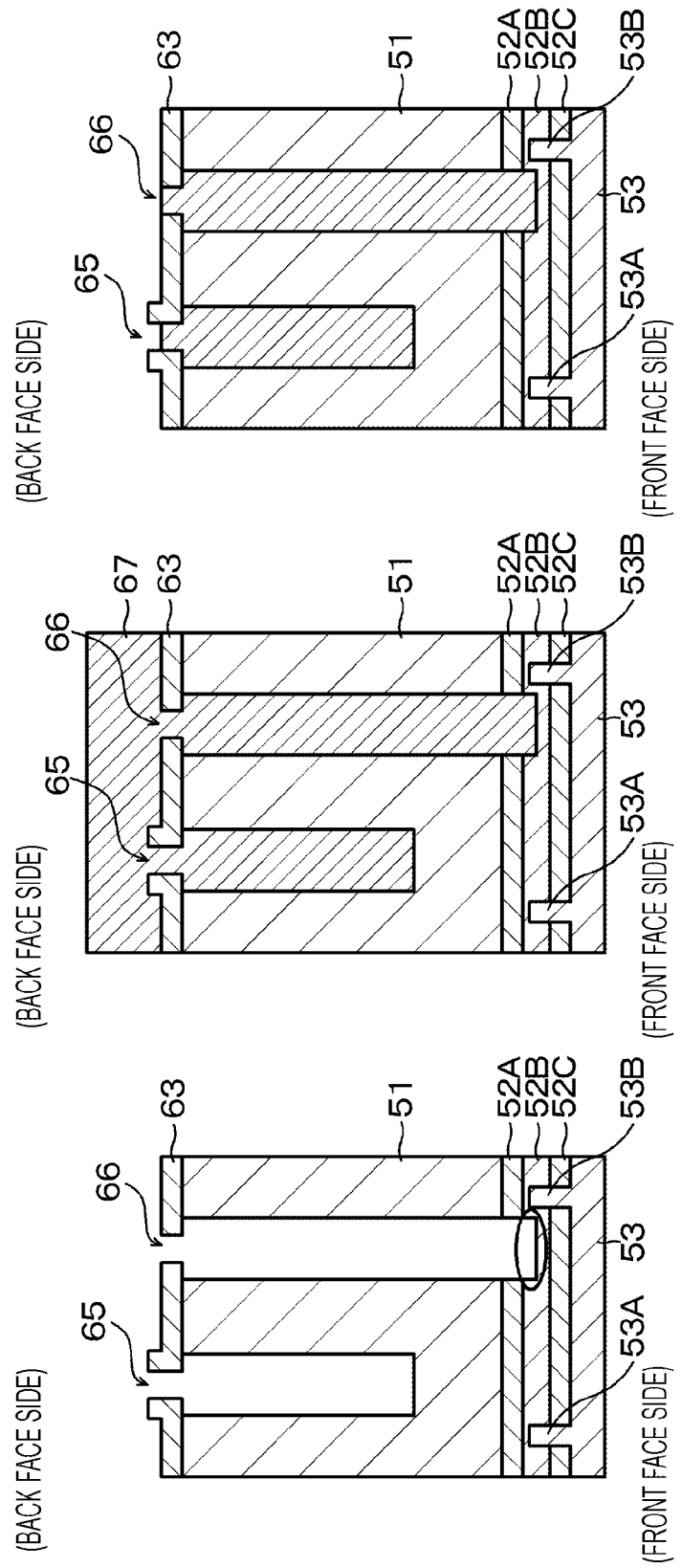
FIG. 12 is a step diagram (part 4) for describing a method for manufacturing a CMOS image sensor according to Example 2.
Figure 13:
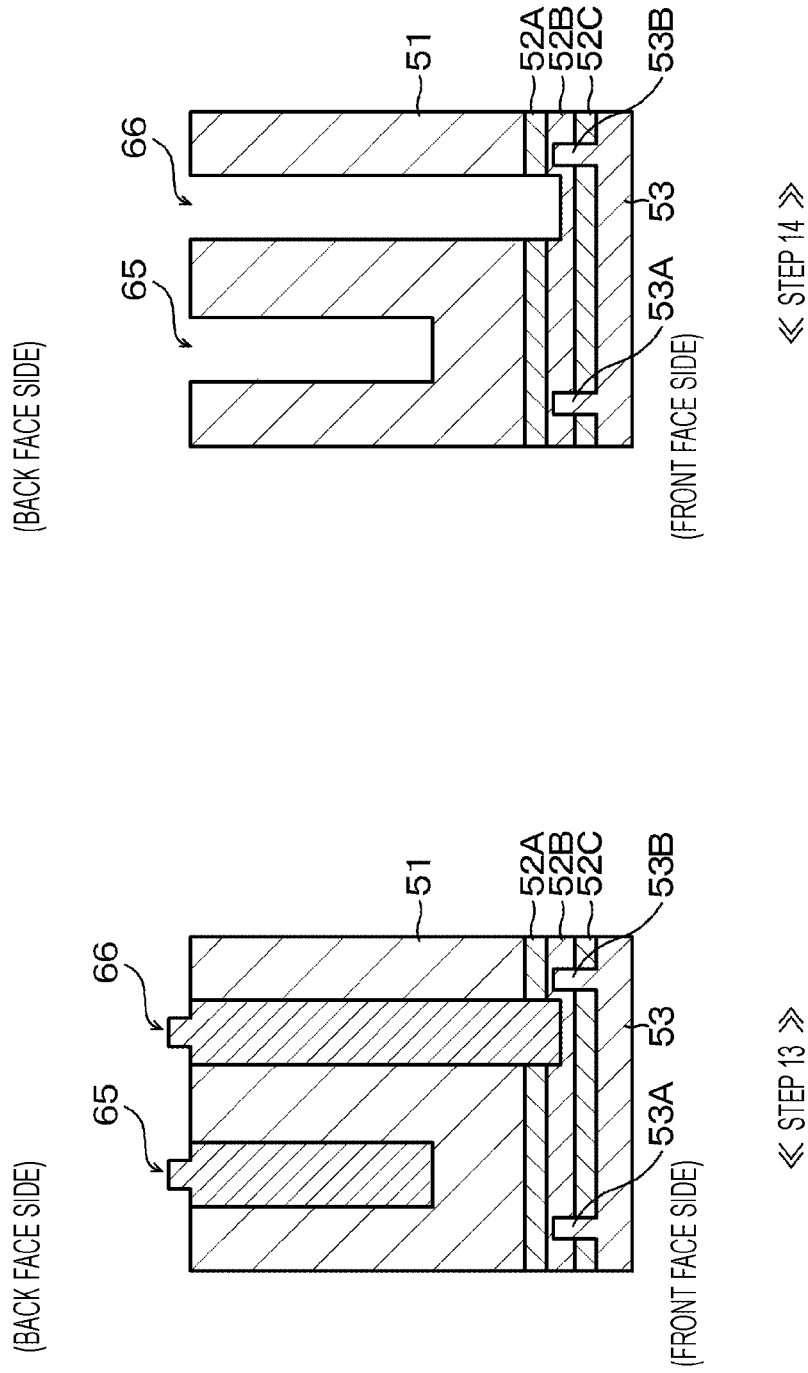
FIG. 13 is a step diagram (part 5) for describing a method for manufacturing a CMOS image sensor according to Example 2.
Figure 14:
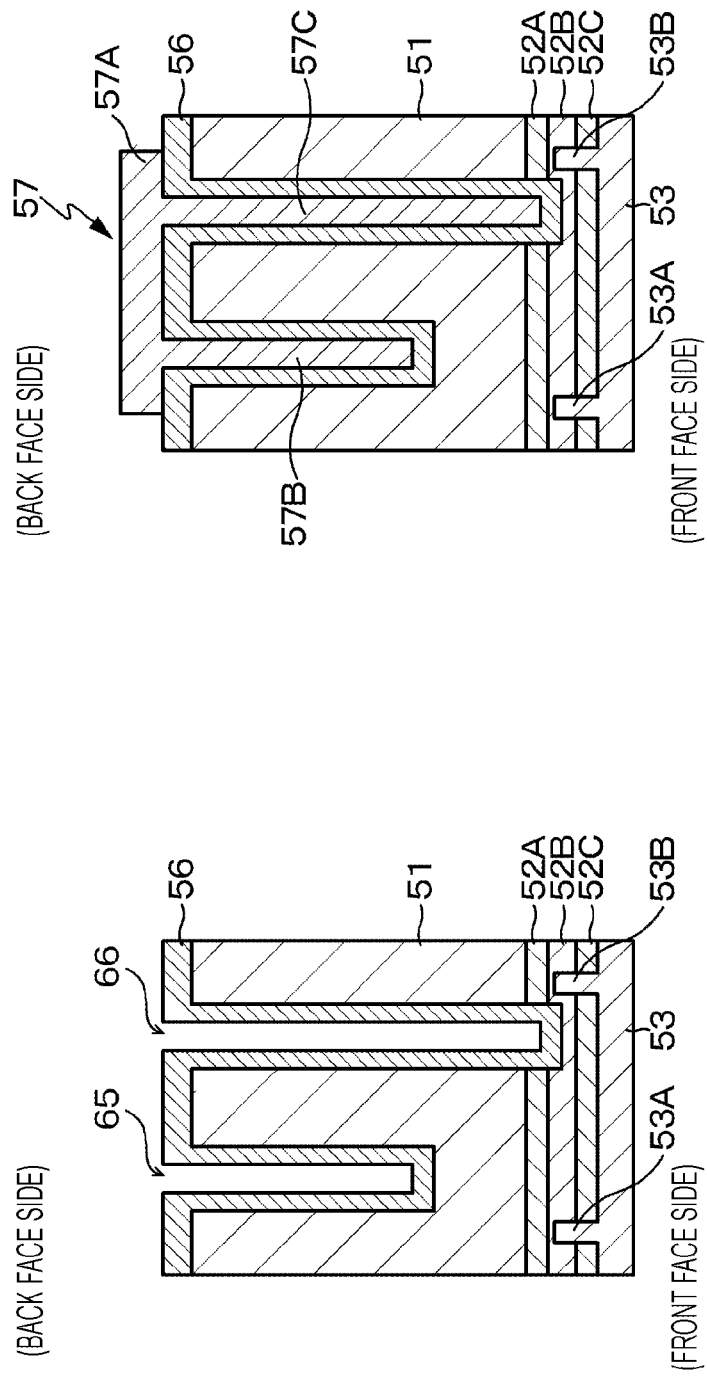
FIG. 14 is a step diagram (part 6) for describing a method for manufacturing a CMOS image sensor according to Example 2.

FIG. 8 shows a simulation result regarding light leakage noise in a case of a light blocking structure in which the protrusion section 53A and the protrusion section 53B are provided in the first light blocking film 53 and in a case of a light blocking structure in which the protrusion section 53A and the protrusion section 53B are not provided. This simulation result is an example in a case where, for example, the light of the light source is red light in a CMOS image sensor in which the size of the unit pixel 20 is 3.875 μm×3.875 μm. FIG. 8 shows light leakage noise of each of pixels of R (red), Gr (green in the row of red), Gb (green in the row of blue), and B (blue) in the Bayer arrangement.

In FIG. 8, the oblique line pattern in an obliquely right lower direction on the right side shows light leakage noise in a case of a light blocking structure in which the protrusion section 53A and the protrusion section 53B are provided in the first light blocking film 53, and the oblique line pattern in an obliquely left lower direction on the left side shows light leakage noise in a case of a light blocking structure in which the protrusion section 53A and the protrusion section 53B are not provided in the first light blocking film 53. From this simulation result, it can be seen that light leakage noise has been improved successfully by employing a light blocking structure in which the protrusion section 53A and the protrusion section 53B are provided in the first light blocking film 53.

Example 2

Example 2 is an example of a method for manufacturing the CMOS image sensor 10 having the light blocking structure according to Example 1.

FIG. 9, FIG. 10, FIG. 11, FIG. 12, FIG. 13, and FIG. 14 are step diagrams for describing a method for manufacturing the CMOS image sensor 10 according to Example 2, that is, a method for manufacturing the CMOS image sensor 10 having the light blocking structure according to Example 1. In FIG. 9, FIG. 10, FIG. 11, FIG. 12, FIG. 13, and FIG. 14, the illustration of the photodiode 21, the charge retention section 24, the wiring layer 54, and the gate electrode 55 is omitted for easier viewing of the drawings.

First, on the front face (boundary face) side of the semiconductor substrate 51, the steps up to, for example, the formation of the gate electrode 55 (see FIG. 3) corresponding to the gate electrode 221 of the first transfer gate section 22 of FIG. 2 are similar to the process of an ordinary CMOS image sensor. Next, the insulating film layer 52, that is, the first insulating film 52A, the second insulating film 52B, and the third insulating film 52C are formed as a film on the boundary face of the semiconductor substrate 51.

Next, in step 1, the patterning of a photoresist 61 is performed on the third insulating film 52C, and an opening 61A and an opening 61B are formed in agreement with the positions where the protrusion section 53A and the protrusion section 53B of the first light blocking film 53 are to be formed, respectively.

Next, in step 2, the third insulating film 52C, the second insulating film 52B, and the first insulating film 52A are processed via the opening 61A and the opening 61B of the photoresist 61, and a trench 62A and a trench 62B are formed in agreement with the positions where the protrusion section 53A and the protrusion section 53B of the first light blocking film 53 are to be formed. In this event, the trench 62A and the trench 62B are formed up to partway through the second insulating film 52B so that the bottom faces do not reach the semiconductor substrate 51. After that, the photoresist 61 is removed.

Next, in step 3, the first light blocking film 53 is formed as a film on the third insulating film 52C. The first light blocking film 53 can be formed by using, for example, a metal having light blocking properties, such as tungsten. During the film formation of the first light blocking film 53, the protrusion section 53A and the protrusion section 53B of the first light blocking film 53 are formed in the trench 62A and the trench 62B.

Although the illustration is omitted, interlayer insulating films, contacts, and wirings are formed after the film formation of the first light blocking film 53, and thereby the wiring layer 54 (see FIG. 3) is formed. After that, the wiring layer 54 and a not-illustrated support substrate are stuck together.

Then, the processing of the back face (incident face) side of the semiconductor substrate 51 is performed. Specifically, in step 4, a pattern including a hard mask 63 is formed on the incident face of the semiconductor substrate 51. The hard mask 63 includes, for example, a SiO$_2$ film.

Next, in step 5, a pattern including a photoresist 64 is formed on the surface of the hard mask 63. Specifically, the photoresist 64 is applied on the surface of the hard mask 63. Next, the patterning of the photoresist 64 is performed, and an opening 64A and an opening 64B are formed in agreement with the positions where the not-piercing light blocking section 57B and the piercing light blocking section 57C are to be formed, respectively.

Next, in step 6, the hard mask 63 is processed via the opening 64A and the opening 64B of the photoresist 64, and a trench 65 and a trench 66 are formed in agreement with the positions where the not-piercing light blocking section 57B and the piercing light blocking section 57C are to be formed. After that, the photoresist 64 is removed.

Next, in step 7, a pattern including a photoresist 67 is formed on the surface of the hard mask 63 so as to fill the trench 65. The photoresist 67 prevents a situation where the semiconductor substrate 51 is processed via the trench 65 in the next step 8.

Next, in step 8, the semiconductor substrate 51 is processed, and the trench 66 is dug down partway through the semiconductor substrate 51. Note that the depth of the trench 66 is adjusted in accordance with the processing time of the semiconductor substrate 51 in the next step 9.

Next, in step 9, the photoresist 67 is removed. Then, the semiconductor substrate 51 is processed, and the trench 65 and the trench 66 are simultaneously dug down. In this event, the processing is performed until the trench 66 pierces the semiconductor substrate 51 and reaches the first insulating film 52A. Thereby, the trench 65 is dug down partway through the semiconductor substrate 51. Here, the width in a direction parallel to the incident face of the semiconductor substrate 51 of the trench 66 that has undergone the second round of processing is wider than the width of the trench 65 that has undergone the first round of processing.

Next, in step 10, damage due to the processing of the side walls of the trench 65 and the trench 66 is removed by isotropic etching using chemical dry etching (CDE), and the shapes of the trench 65 and the trench 66 are optimized. In this event, the first insulating film 52A at the bottom of the trench 66 is removed by the isotropic etching, and the trench 66 reaches the second insulating film 52B as shown by the portion surrounded by the circle in the drawing. Note that the width of the trench 66 is kept wider than the width of the trench 65. Therefore, the width of the piercing light blocking section 57C formed in the trench 66 is to be wider than the width of the not-piercing light blocking section 57B formed in the trench 65.

Next, in step 11, the surface of the hard mask 63, the interior of the trench 65, and the interior of the trench 65 are coated with a pattern including a photoresist 67. The photoresist 67 prevents a situation where, in the next steps 12 and 13, the trench 66 is dug down due to a chemical liquid for removing the hard mask 63.

Next, in step 12, etchback is performed to remove the photoresist 67 on the surface of the hard mask 63 and remove part of the surface of the hard mask 63. Note that the photoresist 67 in the trench 65 and the trench 66 is retained as it is.

Next, in step 13, wet etching is performed using buffered hydrofluoric acid (BHF). The hard mask 63 is removed by the wet etching.

Next, in step 14, SH treatment using sulfuric acid and hydrogen peroxide solution is performed to remove the photoresist 67 in the trench 65 and the trench 66. In this event, a situation where the first light blocking film 53 is dissolved is prevented by stopping the depth of the trench 66 in the second insulating film 52B in step 10.

Next, in step 15, the multiple-layer film 56 is formed so as to cover the incident face of the semiconductor substrate 51, and the inner walls and the bottom faces of the trench 65 and the trench 66. The multiple-layer film 56 includes, for example, a film of a three-layer structure in which a fixed charge film, an anti-reflection film, and an insulating film are stacked in this order from the side near to the semiconductor substrate 51. After that, annealing treatment is performed.

Next, in step 16, a barrier film (not illustrated) including a film of Ti, TiN, or the like is formed so as to cover the surface of the multiple-layer film 56, and the inner walls and the bottom faces of the trench 65 and the trench 66. Then, the second light blocking film 57 is formed so as to be embedded in the trench 65 and the trench 66 of the semiconductor substrate 51 and cover the incident face of the semiconductor substrate 51. In this event, the patterning of the surface light blocking section 57A on the incident face of the semiconductor substrate 51 is performed such that the light receiving face of the photodiode 21 is exposed.

After that, although the illustration is omitted, a passivation film is formed on the incident face of the semiconductor substrate 51, and then the formation of a color filter, lenses, a pad, etc. is performed.

A back-side illumination CMOS image sensor 10 having the light blocking structure according to Example 1 in which the incidence of light on the charge retention section 24 can be suppressed can be manufactured by the method for manufacturing the CMOS image sensor 10 according to Example 2 described above.

Note that Patent Document 1 described above does not disclose a specific method for forming a light blocking film. Therefore, the technology described in Patent Document 1 has a concern that, for example, a trench for forming a light blocking film will be dug too deep and a light blocking film will protrude to a wiring layer, and trouble of shapes, etc. will occur during the formation of a light blocking film and contacts on the front face side of a semiconductor substrate; consequently, degradation of image quality, such as white spots, will be caused.

Example 3

Figure 15:
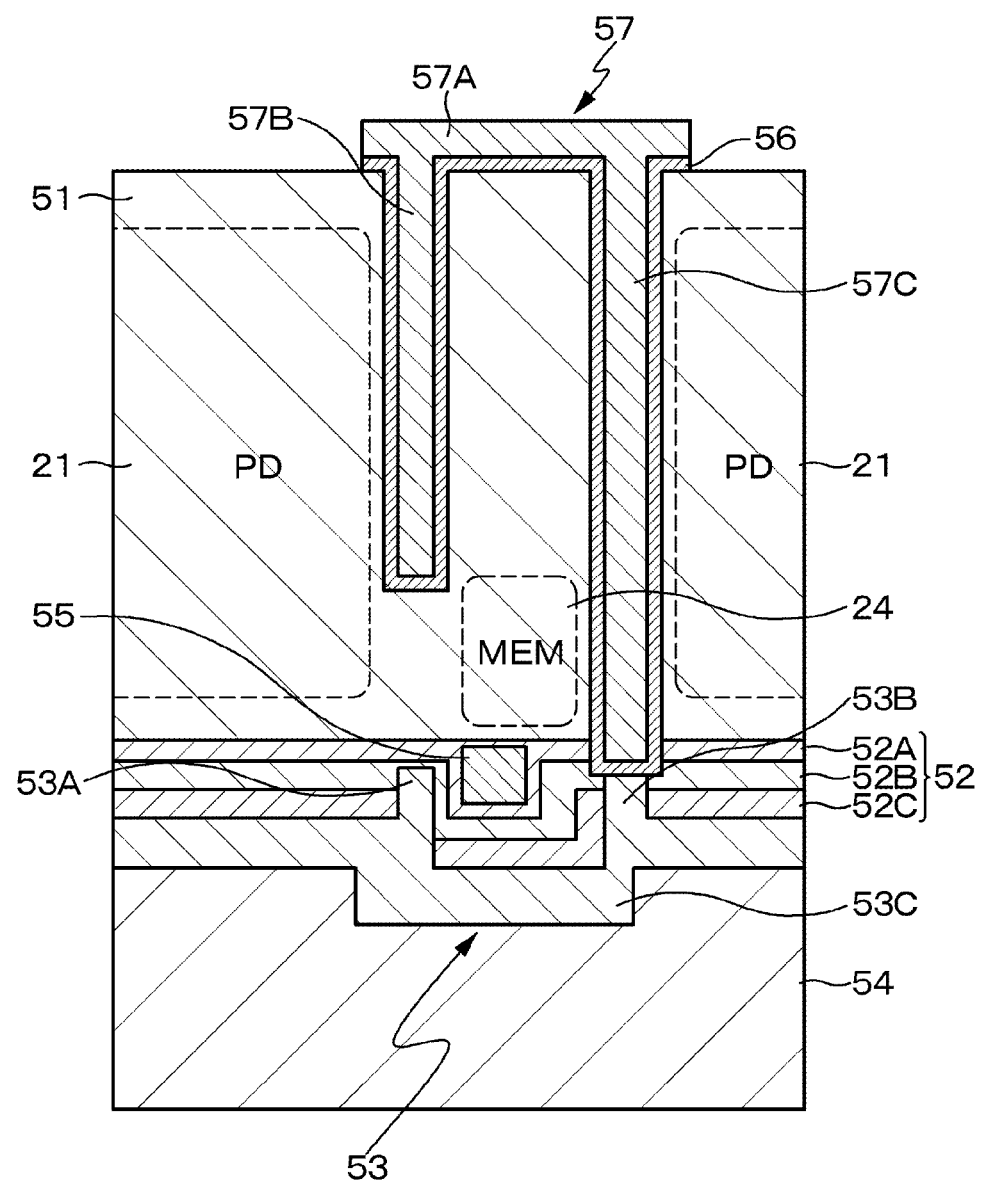
FIG. 15 is a cross-sectional view schematically showing a CMOS image sensor having a light blocking structure according to Example 3.

Example 3 is a modification example of the light blocking structure according to Example 1. FIG. 15 schematically shows a cross-sectional view of a CMOS image sensor 10 having a light blocking structure according to Example 3.

The light blocking structure according to Example 1 has a structure in which the protrusion section 53A and the protrusion section 53B of the first light blocking film 53 are provided in parts more on the sides of the photodiodes 21 than immediately below the formation positions of the not-piercing light blocking section 57B and the piercing light blocking section 57C of the second light blocking film 57. In contrast, a light blocking structure according to Example 3 has a structure in which, as shown in FIG. 15, the protrusion section 53A and the protrusion section 53B of the first light blocking film 53 are provided in parts immediately below the formation positions of the not-piercing light blocking section 57B and the piercing light blocking section 57C of the second light blocking film 57.

Also in a case of the light blocking structure according to Example 3 described above, similar action and effect to those in a case of the light blocking structure according to Example 1 can be obtained for the protrusion section 53A and the protrusion section 53B of the first light blocking film 53. That is, a situation where light that is not absorbed by the photodiode 21 but is transmitted through the semiconductor substrate 51, and is reflected at the upper face of the flat section 53C of the first light blocking film 53 is incident on the charge retention section 24 is obstructed by the protrusion section 53A and the protrusion section 53B. Thereby, the occurrence of optical noise caused by a situation where light reflected at the flat face section of the first light blocking film 53 is incident on the charge retention section 24 is suppressed, and therefore light leakage noise can be improved more surely.

Note that, although the light blocking structure according to Example 3 has a structure in which the protrusion section 53A and the protrusion section 53B are provided similarly in parts immediately below the formation positions of the not-piercing light blocking section 57B and the piercing light blocking section 57C, also a structure in which the protrusion section 53A or the protrusion section 53B is provided in a part immediately below the formation position of the not-piercing light blocking section 57B or the piercing light blocking section 57C is possible.

Example 4

Figure 16:
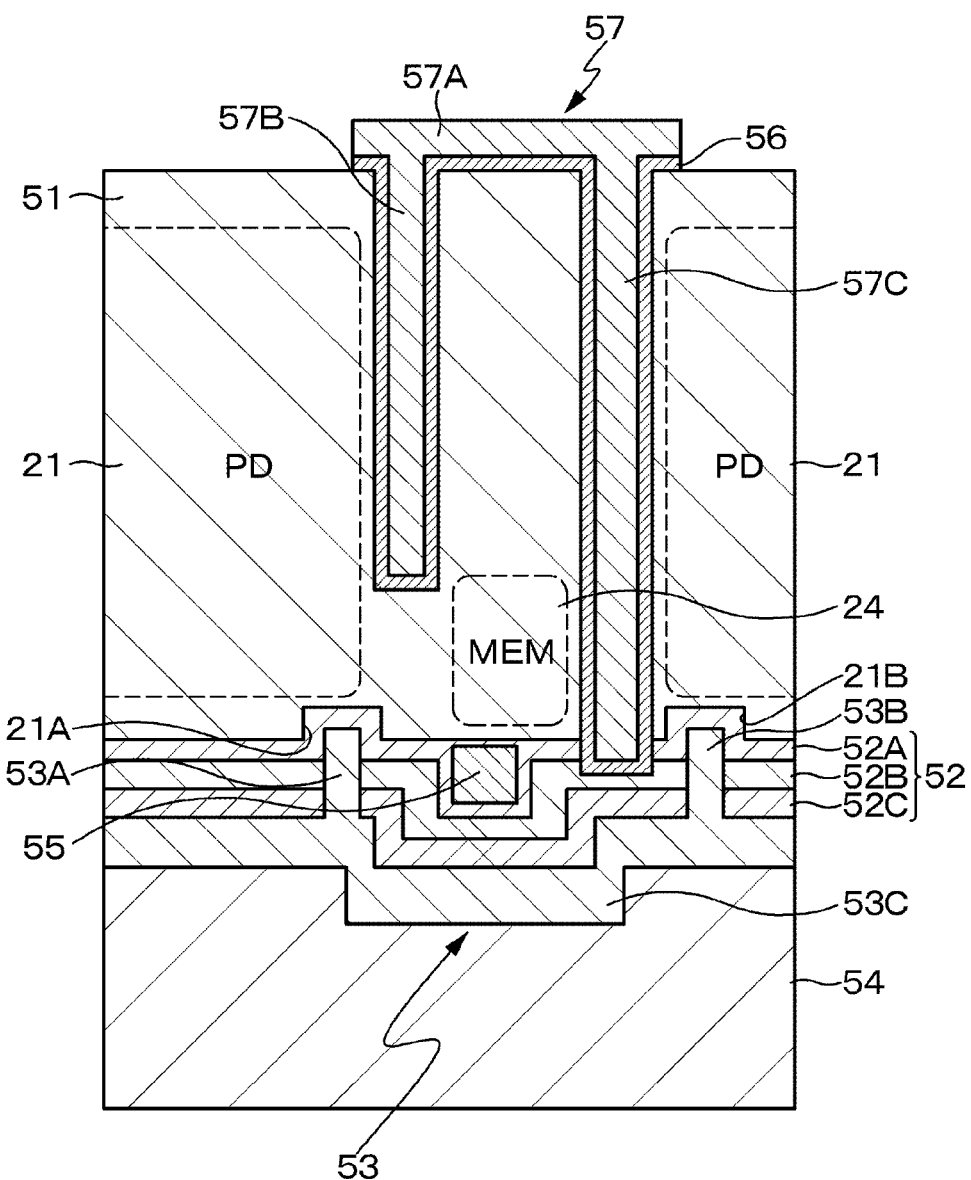
FIG. 16 is a cross-sectional view schematically showing a CMOS image sensor having a light blocking structure according to Example 4.

Example 4 is a modification example of the light blocking structure according to Example 1. FIG. 16 schematically shows a cross-sectional view of a CMOS image sensor 10 having a light blocking structure according to Example 4.

The light blocking structure according to Example 1 has a structure in which the protrusion section 53A and the protrusion section 53B of the first light blocking film 53 are provided in a state of protruding into the insulating film layer 52. In contrast, a light blocking structure according to Example 4 has a structure in which, as shown in FIG. 16, the protrusion section 53A and the protrusion section 53B are provided in a state of protruding into the semiconductor substrate 51 via the insulating film layer 52. In this event, since the protrusion section 53A and the protrusion section 53B contain a metal having light blocking properties, such as tungsten, the insulating film layer 52 is interposed between the protrusion section 53A and the protrusion section 53B, and the semiconductor substrate 51.

In a case of the light blocking structure according to Example 1, the protrusion section 53A and the protrusion section 53B are caused to be embedded in the semiconductor substrate 51 in the following way, as an example. That is, after the patterning and processing of the semiconductor substrate 51 are performed, a trench 21A and a trench 21B extending in the direction perpendicular to the drawing sheet are formed in agreement with the positions where the protrusion section 53A and the protrusion section 53B of the first light blocking film 53 are to be formed. After that, the first insulating film 52A is formed as a film with a thickness within the range of, for example, 10 nm to 20 nm. In this event, the first insulating film 52A is embedded in the trench 21A and the trench 21B. After that, the second insulating film 52B is formed as a film with a thickness within the range of, for example, 50 nm to 100 nm, and furthermore the third insulating film 52C is formed as a film with a thickness within the range of, for example, 30 nm to 100 nm. After that, patterning and processing are performed; thereby, the protrusion section 53A and the protrusion section 53B containing a metal having light blocking properties, such as tungsten, are caused to be embedded in the trench 21A and the trench 21B of the semiconductor substrate 51.

By thus providing the protrusion section 53A and the protrusion section 53B of the first light blocking film 53 in a state of protruding into the semiconductor substrate 51, the height of the protrusion section 53A and the protrusion section 53B can be set higher than in a case of the light blocking structure according to Example 1 in which the protrusion sections are provided in a state of protruding into the insulating film layer 52. Therefore, a situation where light that is not absorbed by the photodiode 21 but is transmitted through the semiconductor substrate 51, and is reflected at the upper face of the flat section 53C of the first light blocking film 53 is incident on the charge retention section 24 can be obstructed more surely by the protrusion section 53A and the protrusion section 53B.

Example 5

Figure 17:
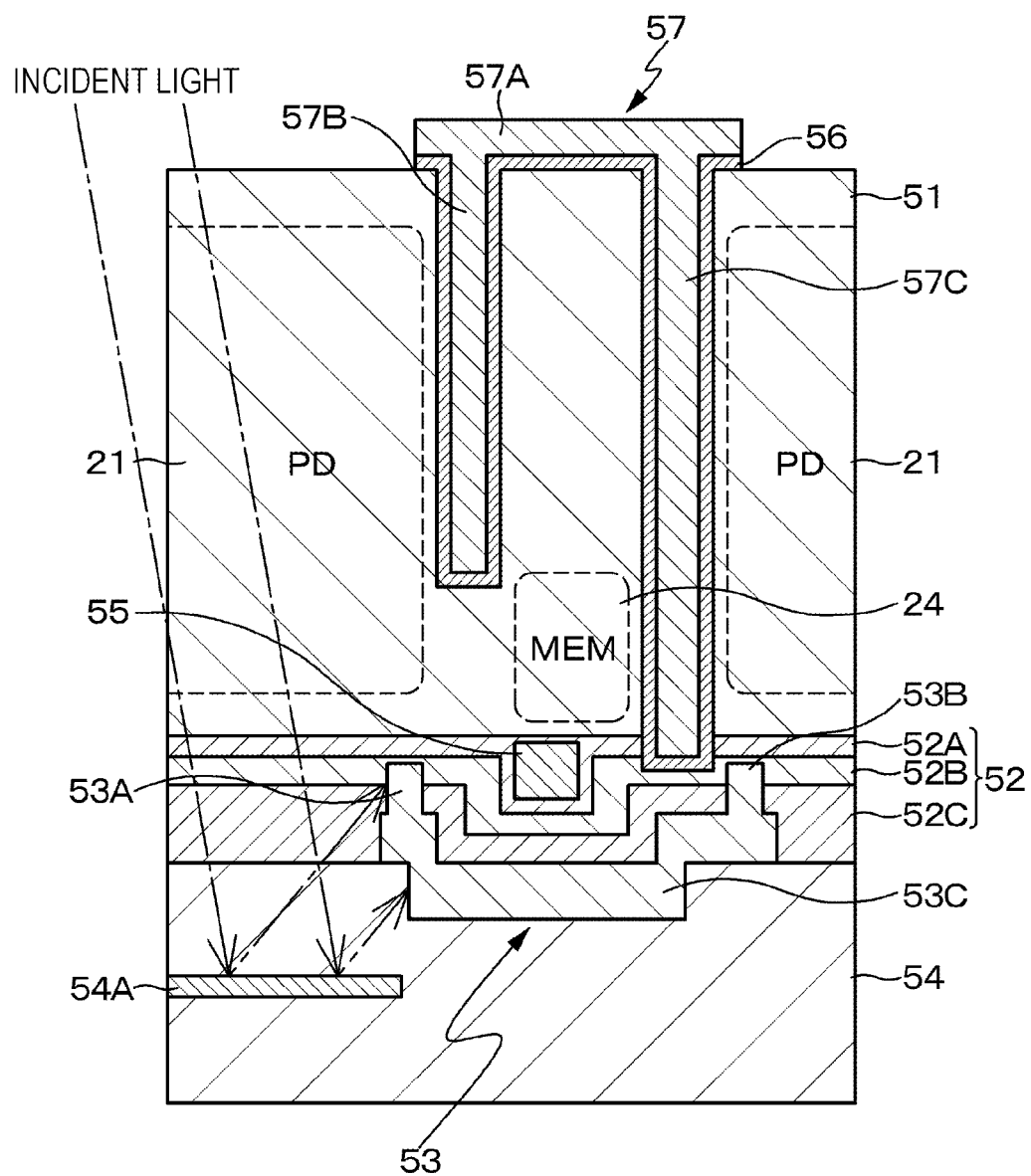
FIG. 17 is a cross-sectional view schematically showing a CMOS image sensor having a light blocking structure according to Example 5.

Example 5 is a modification example of the light blocking structure according to Example 1. FIG. 17 schematically shows a cross-sectional view of a CMOS image sensor 10 having a light blocking structure according to Example 5.

The light blocking structure according to Example 1 has a structure in which the first light blocking film 53 is provided so as to cover the formation regions of the photodiode 21 and the charge retention section 24. In contrast, a light blocking structure according to Example 5 has a structure in which the first light blocking film 53 is provided so as to generally cover the formation region of the charge retention section 24 while avoiding parts of the formation regions of the photodiodes 21.

In a case of a light blocking structure in which the first light blocking film 53 is thus formed while avoiding parts of the formation regions of the photodiodes 21, although light not absorbed by the photodiode 21 but transmitted through the semiconductor substrate 51 is not reflected at the first light blocking film 53, such light may be reflected at a wiring 54A of the wiring layer 54. In this regard, in the light blocking structure according to Example 5, a situation where light reflected at the wiring 54A is incident on the charge retention section 24 is obstructed by the side face of the flat section 53C, the protrusion section 53A, and the protrusion section 53B of the first light blocking film 53. Thereby, the occurrence of optical noise caused by a situation where light reflected at the wiring 54A is incident on the charge retention section 24 is suppressed, and therefore light leakage noise can be improved more surely.

Example 6

Figure 18:
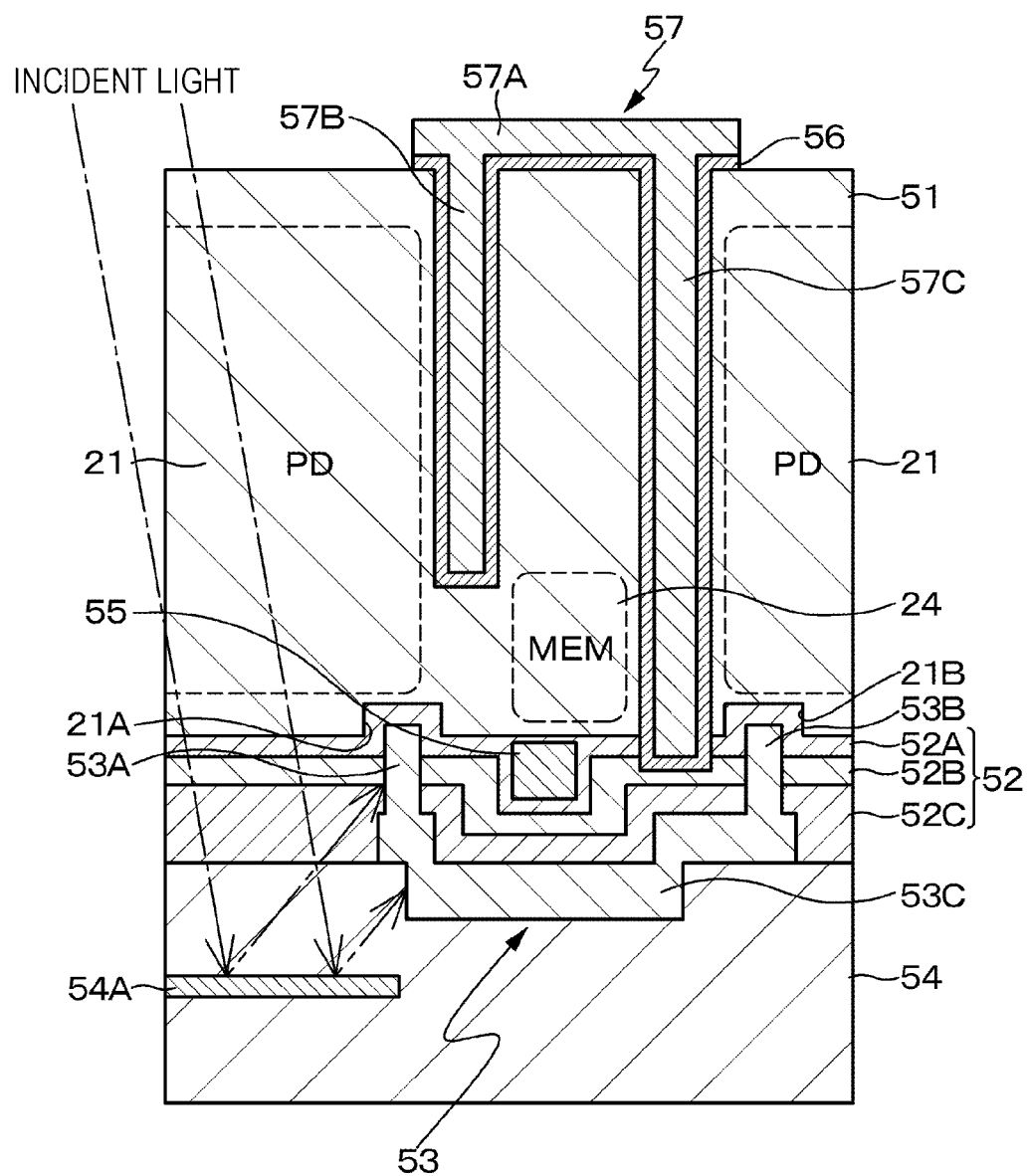
FIG. 18 is a cross-sectional view schematically showing a CMOS image sensor having a light blocking structure according to Example 6.

Example 6 is an example of combination of Example 4 and Example 5. FIG. 18 schematically shows a cross-sectional view of a CMOS image sensor 10 having a light blocking structure according to Example 5.

The light blocking structure according to Example 5 has a light blocking structure in which the light blocking structure according to Example 4 and the light blocking structure according to Example 5 are combined. That is, this is a structure in which the protrusion section 53A and the protrusion section 53B are provided in a state of protruding into the semiconductor substrate 51 via the insulating film layer 52, and the first light blocking film 53 is provided so as to generally cover the formation region of the charge retention section 24 while avoiding parts of the formation regions of the photodiodes 21.

By the light blocking structure according to Example 5, the height of the protrusion section 53A and the protrusion section 53B can be set higher than in a case of the light blocking structure according to Example 5 in which the protrusion sections are provided in a state of protruding into the insulating film layer 52. Therefore, a situation where light reflected at the wiring 54A is incident on the charge retention section 24 can be obstructed more surely.

Example 7

Example 7 is modification examples of Example 1, and is other pattern examples of the protrusion section of the first light blocking film 53 in the light blocking structure according to Example 1. The protrusion section of the first light blocking film 53 in the light blocking structure according to Example 1 is a pattern including two protrusion sections 53A and 53B formed parallel along the longitudinal direction of the charge retention section 24 (see FIG. 4).

FIG. 19, FIG. 20, FIG. 21, and FIG. 22 show pattern example 1 to pattern example 6 of the protrusion section of the first light blocking film 53 according to Example 7. Pattern example 1 to pattern example 6 can not only be applied to the light blocking structure according to Example 1 but also be similarly applied to the light blocking structures according to Example 3 to Example 6.

Pattern Example 1

Figure 19A:
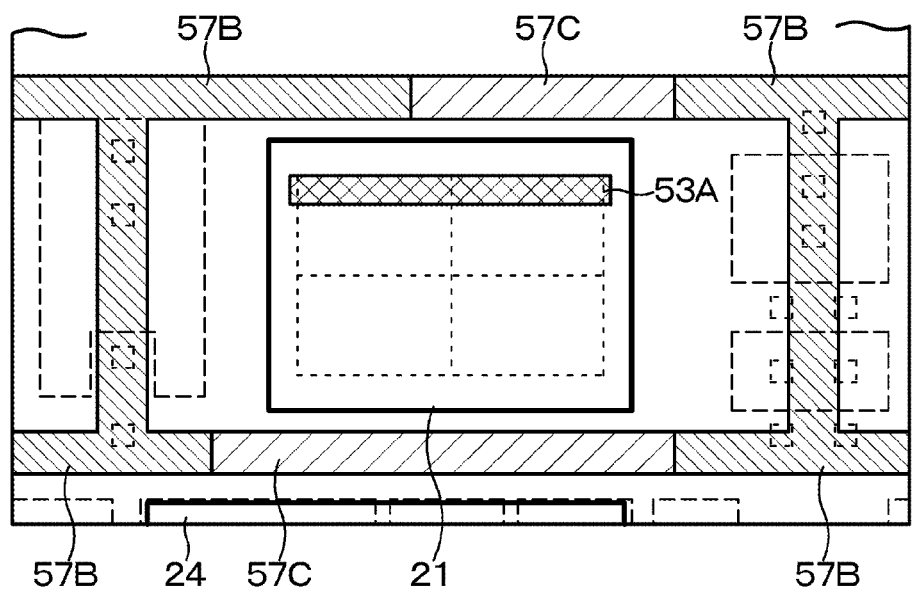
FIG. 19A is a planar pattern diagram showing pattern example 1 of a protrusion section of a first light blocking film according to Example 7.

FIG. 19A is a planar pattern diagram showing pattern example 1 of the protrusion section of the first light blocking film 53 according to Example 7. In pattern example 1, the protrusion section of the first light blocking film 53 includes one protrusion section 53A formed along the longitudinal direction of the charge retention section 24. In a case of this pattern example 1, a situation where light that is not absorbed by the photodiode 21 but is transmitted through the semiconductor substrate 51, and is reflected at the upper face of the flat section 53C of the first light blocking film 53 is incident on the charge retention section 24 can be obstructed by the protrusion section 53A (see FIG. 7).

Pattern Example 2

Figure 19B:
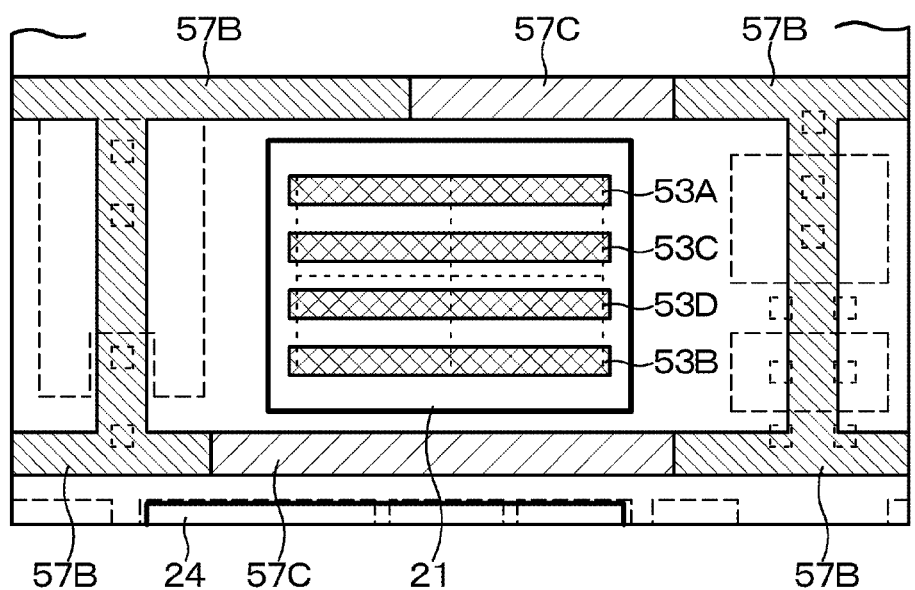
FIG. 19B is a planar pattern diagram showing pattern example 2 of the protrusion section of the first light blocking film according to Example 7.

FIG. 19B is a planar pattern diagram showing pattern example 2 of the protrusion section of the first light blocking film 53 according to Example 7. In pattern example 2, in addition to the two protrusion sections 53A and 53B in the light blocking structure according to Example 1, there are, for example, two protrusion sections 53C and 53D between the protrusion section 53A and the protrusion section 53B; that is, there are a total of four protrusion sections 53A, 53B, 53C, and 53D. In a case of this pattern example 2, a situation where light reflected at the flat face section of the first light blocking film 53 is incident on the charge retention section 24 can be obstructed more surely by the two protrusion sections 53C and 53D being added between the two protrusion sections 53A and 53B. Note that, although in the present example two protrusion sections are added between the two protrusion sections 53A and 53B, the configuration is not limited to this, and the number of protrusion sections added is arbitrary.

Pattern Example 3

Figure 20A:
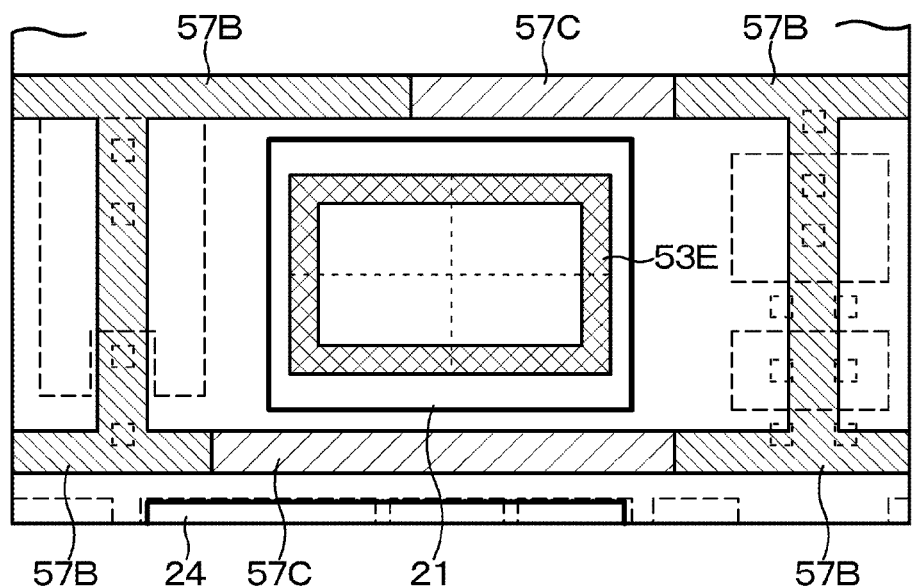
FIG. 20A is a planar pattern diagram showing pattern example 3 of a protrusion section of a first light blocking film according to Example 7.

FIG. 20A is a planar pattern diagram showing pattern example 3 of the protrusion section of the first light blocking film 53 according to Example 7. In pattern example 3, the protrusion section of the first light blocking film 53 includes a protrusion section 53E formed in a rectangular ring shape in the formation region of the photodiode 21. In a case of this pattern example 2, a situation where light from all directions reflected at the upper face of the flat section 53C of the first light blocking film 53 is incident on the charge retention section 24 can be obstructed surely by the protrusion section 53C.

Pattern Example 4

Figure 20B:
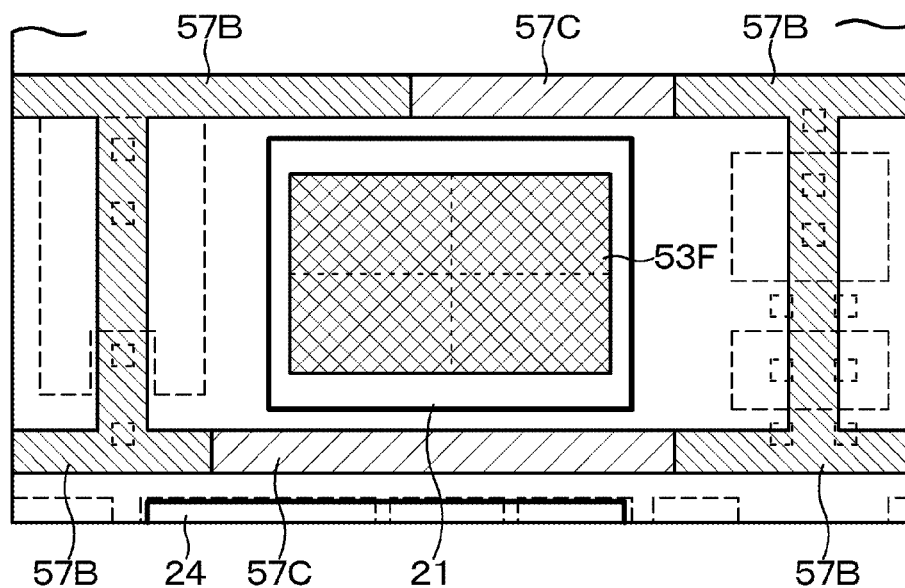
FIG. 20B is a planar pattern diagram showing pattern example 4 of the protrusion section of the first light blocking film according to Example 7.

FIG. 20B is a planar pattern diagram showing pattern example 4 of the protrusion section of the first light blocking film 53 according to Example 7. In pattern example 4, the interior of a region corresponding to the formation region of the photodiode 21 is dug in, and there is a protrusion section 53F formed entirely in the dug region. Thus, a situation where light reflected at the upper face of the flat section 53C of the first light blocking film 53 is incident on the charge retention section 24 can be blocked also by a pattern including the protrusion section 53F formed entirely in a region that is dug in to correspond to the formation region of the photodiode 21.

Pattern Example 5

Figure 21:
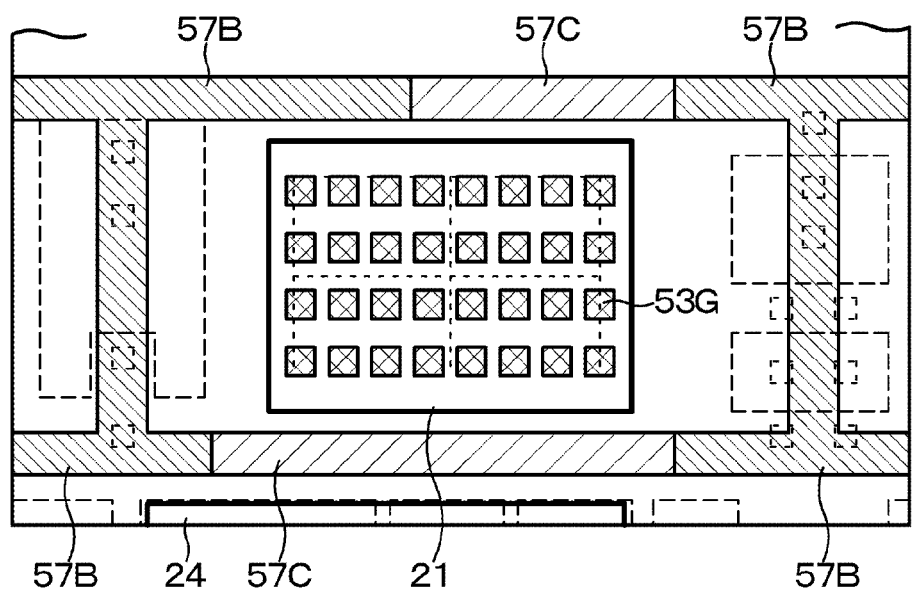
FIG. 21 is a planar pattern diagram showing pattern example 5 of the protrusion section of the first light blocking film according to Example 7.

FIG. 21 is a planar pattern diagram showing pattern example 5 of the protrusion section of the first light blocking film 53 according to Example 7. Pattern example 5 includes a set of a large number of dotted protrusion sections 53G formed in a region corresponding to the formation region of the photodiode 21. Thus, a situation where light reflected at the upper face of the flat section 53C of the first light blocking film 53 is incident on the charge retention section 24 can be obstructed also by a pattern including a set of a large number of dotted protrusion sections 53G formed in the formation region of the photodiode 21.

Pattern Example 6

Figure 22:
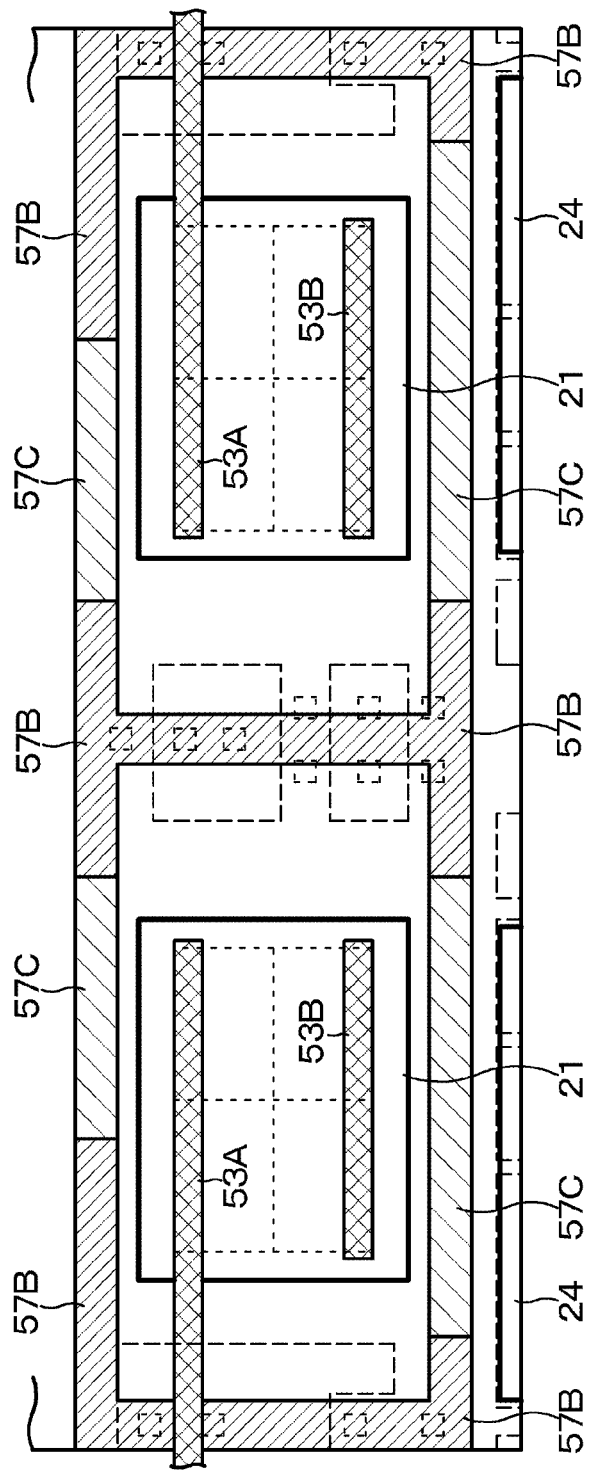
FIG. 22 is a planar pattern diagram showing pattern example 6 of the protrusion section of the first light blocking film according to Example 7.

FIG. 22 is a planar pattern diagram showing pattern example 6 of the protrusion section of the first light blocking film 53 according to Example 7. Pattern example 6 is a modification example of the two protrusion sections 53A and 53B in the light blocking structure according to Example 1; the protrusion section 53A on the side nearer to the transfer gate 55 in FIG. 3 is formed to be prolonged up to another pixel. Thus, a situation where light reflected at the upper face of the flat section 53C of the first light blocking film 53 is incident on the charge retention section 24 can be obstructed also by the protrusion section 53A formed to be prolonged up to another pixel.

Second Embodiment

Figure 23:
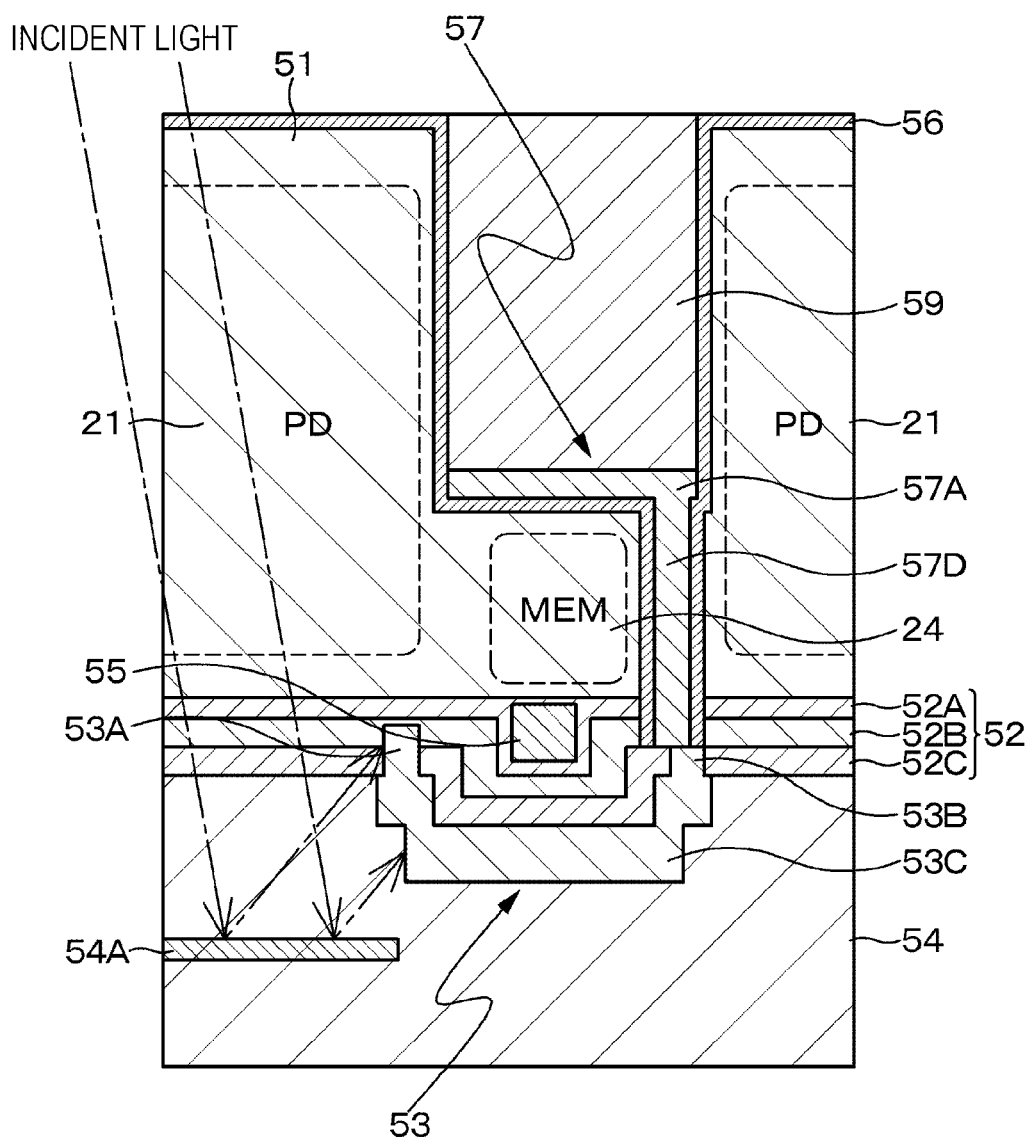
FIG. 23 is a cross-sectional view schematically showing a CMOS image sensor having a light blocking structure according to a second embodiment.

A light blocking structure according to a second embodiment of the present disclosure will now be described using FIG. 23. FIG. 23 is a cross-sectional view schematically showing a CMOS image sensor having a light blocking structure according to the second embodiment.

A CMOS image sensor 10 having a light blocking structure according to the second embodiment has a configuration in which the photodiode 21 and the charge retention section 24 are formed in the semiconductor substrate 51, and the insulating film layer 52, the first light blocking film 53, and the wiring layer 54 are stacked on the front face (the second face) of the semiconductor substrate 51 in this order from the side near to the front face.

Further, in the CMOS image sensor 10, on the incident face (back face) side of the semiconductor substrate 51, a region corresponding to the formation region of the charge retention section 24 is dug to the depth of the vicinity of the charge retention section 24. Then, in a bottom portion of the dug portion, the second light blocking film 57 is formed via the multiple-layer film 56, and further an oxide film 59 such as a SiO$_2$ film is embedded, for example. The multiple-layer film 56 includes, for example, a film of a three-layer structure including a fixed charge film, an anti-reflection film, and an insulating film. The insulating film includes, for example, an oxide film such as a SiO$_2$ film.

Note that, although the illustration is omitted, for example, a passivation film, a color filter, microlenses, etc. are stacked on the back face side of the semiconductor substrate 51. Further, for example, a support substrate is stacked under the wiring layer 54.

(With Regard to First Light Blocking Film)

In the light blocking structure according to the second embodiment of the configuration mentioned above, the first light blocking film 53 has the protrusion section 53A and the protrusion section 53B protruding into the insulating film layer 52, like in a case of the light blocking structure according to the first embodiment. In the first light blocking film 53, the protrusion section 53A and the protrusion section 53B are formed integrally with the flat section (main body section) 53C of the first light blocking film 53 by using a metal having light blocking properties, such as tungsten. Note that, for example, the protrusion section 53A may have a structure of being provided in a state of protruding into the semiconductor substrate 51 like in a case of Example 4 of the first embodiment.

(With Regard to Second Light Blocking Film)

The second light blocking film 57 contains, for example, a metal having light blocking properties, such as tungsten. The second light blocking film 57 suppresses mainly a situation where light incident from the incident face of the semiconductor substrate 51 is directly or indirectly incident on the charge retention section 24. The second light blocking film 57 includes a surface light blocking section 57A and the side face light blocking section 57C.

A region of the incident face (the first face) of the semiconductor substrate 51 corresponding to the formation region of the charge retention section 24 is dug to the depth of the vicinity of the charge retention section 24, and the surface light blocking section 57A is provided in a bottom portion of the dug portion. That is, on the incident face side of the semiconductor substrate 51, the surface light blocking section 57A covers a region corresponding to the formation region of the charge retention section 24.

A side face light blocking section 57D is provided between the charge retention section 24 and the photodiode 21 of an adjacent pixel in a state of extending from the surface light blocking section 57A to the insulating film layer 52 along the side face of the charge retention section 24. That is, the side face light blocking section 57D covers the side face of the charge retention section 24 between the charge retention section 24 and the photodiode 21 of an adjacent pixel.

The light blocking structure according to the second embodiment of the configuration mentioned above has a structure in which the surface light blocking section 57A of the second light blocking film 57 is provided in a position deeper than the incident face of the semiconductor substrate 51, in a state of covering a region corresponding to the formation region of the charge retention section 24. Thereby, the incidence of light on the charge retention section 24 can be suppressed, and incident light can be taken into the photodiode 21 more efficiently. In addition, the side face light blocking section 57D is provided in a state of covering the side face of the charge retention section 24, and therefore the light blocking effect for the charge retention section 24 can be enhanced as compared to a case where the side face light blocking section 57D does not exist.

Further, this is a structure in which the protrusion section 53A and the protrusion section 53B protruding on the semiconductor substrate 51 side are provided in the first light blocking film 53. Thereby, a situation where light that is not absorbed by the photodiode 21 but is transmitted through the semiconductor substrate 51, and is reflected at the wiring 54A is incident on the charge retention section 24 is obstructed by the side face of the flat section (main body section) 53C, the protrusion section 53A, and the protrusion section 53B of the first light blocking film 53. As a result, the occurrence of optical noise caused by a situation where light reflected at the wiring 54A is incident on the charge retention section 24 is suppressed, and therefore light leakage noise can be improved more surely.

Modification Examples

Although in the first and second embodiments mentioned above a three-layer structure including three insulating films is given as an example of the insulating film layer 52, also a one-layer structure or a multiple-layer structure other than the three-layer structure is possible. For example, the insulating film layer 52 may have a one-layer structure of the first insulating film 52A. However, in this case, it is necessary to thicken the first insulating film 52A. Further, in a case where a second insulating film 52B with a different composition from the first insulating film 52A is provided, the trench 66 can be more easily stopped in the insulating film layer 52 by, for example, controlling the etching selection ratio in step 10 of Example 2.

Further, for example, the insulating film layer 52 may have a two-layer structure of the first insulating film 52A and the second insulating film 52B. However, in a case where the third insulating film 52C is provided, peeling between the insulating film layer 52 and the first light blocking film 53 and erosion of the second insulating film 52B during the processing of the first light blocking film 53 can be suppressed. Furthermore, for example, the second insulating film 52B may include an oxynitride film such as a SiON film.

Further, the technology according to the present disclosure can be applied to all back-side illumination solid-state imaging elements including the charge retention section 24. Therefore, the configuration of the CMOS image sensor 10 of FIG. 1 and the configuration of the unit pixel 20 of FIG. 2 are only examples of these structures, and the structures may be altered as appropriate. Further, for example, the conductivity type of each semiconductor region may be reversed. In this case, the positive and negative of the applied bias voltage are reversed.

Application Examples

Figure 24:
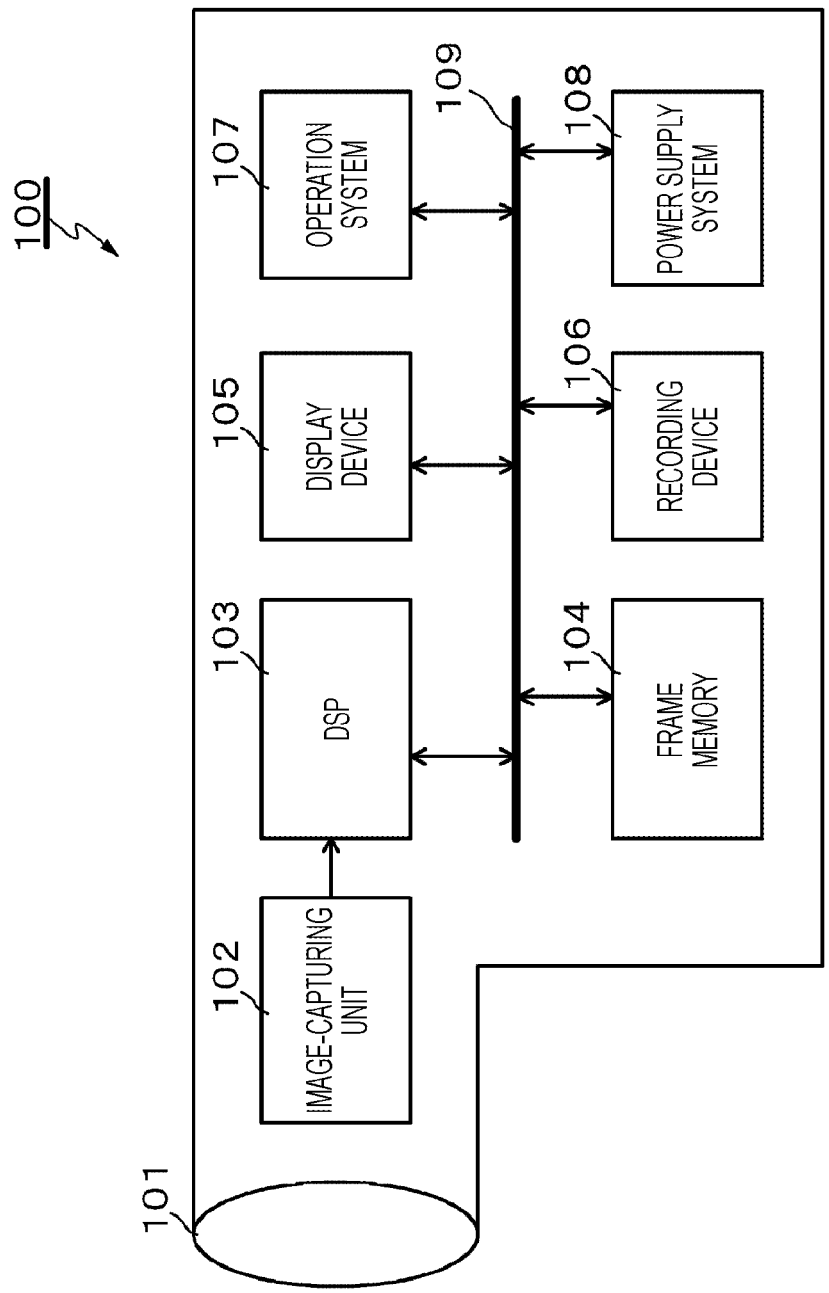
FIG. 24 is a diagram illustrating an applied example of technology according to the present disclosure.

The CMOS image sensor 10 according to the first and second embodiments described above is capable of being used for various devices for sensing light such as visible light, infrared light, ultraviolet light, and X-ray as illustrated, in one example, in FIG. 24. Specific examples of various devices are listed below.

Devices used to capture images for appreciation, such as digital cameras and portable equipment provided with camera function Devices used for traffic, such as in-vehicle sensors that capture images of the front, rear, surroundings, interior, or the like of vehicles for safe driving including automatic stop and recognition of the driver's condition, monitoring cameras for monitoring traveling vehicles and roads, and ranging sensors that measure distance between vehicles Devices used for home appliances, such as TVs, refrigerators, and air conditioners, for capturing images of user's gestures and performing device operations in accordance with the gestures Devices used for medical and healthcare, such as endoscopes and instruments that perform angiography by receiving infrared light Devices used for security, such as security surveillance cameras and personal authentication cameras Devices used for beauty, such as skin measuring instruments for capturing images of skin and microscopes for capturing images of scalp Devices used for sports, such as action cameras and wearable cameras for sports application Devices used for agriculture, such as cameras for monitoring condition of farms or crops Applied Example of Technology According to Present Disclosure The technology according to the present disclosure is applicable to various products. The description of more specific applied examples is now given.

[Electronic Device of Present Disclosure]

The description is now given of a case where the present invention is applied to an electronic device including an image-capturing device such as digital still cameras or video cameras, a portable terminal device provided with an imaging function such as mobile phones, or a copying machine using a solid-state image sensor for an image readout unit.

(Image-Capturing Device)

Figure 25:
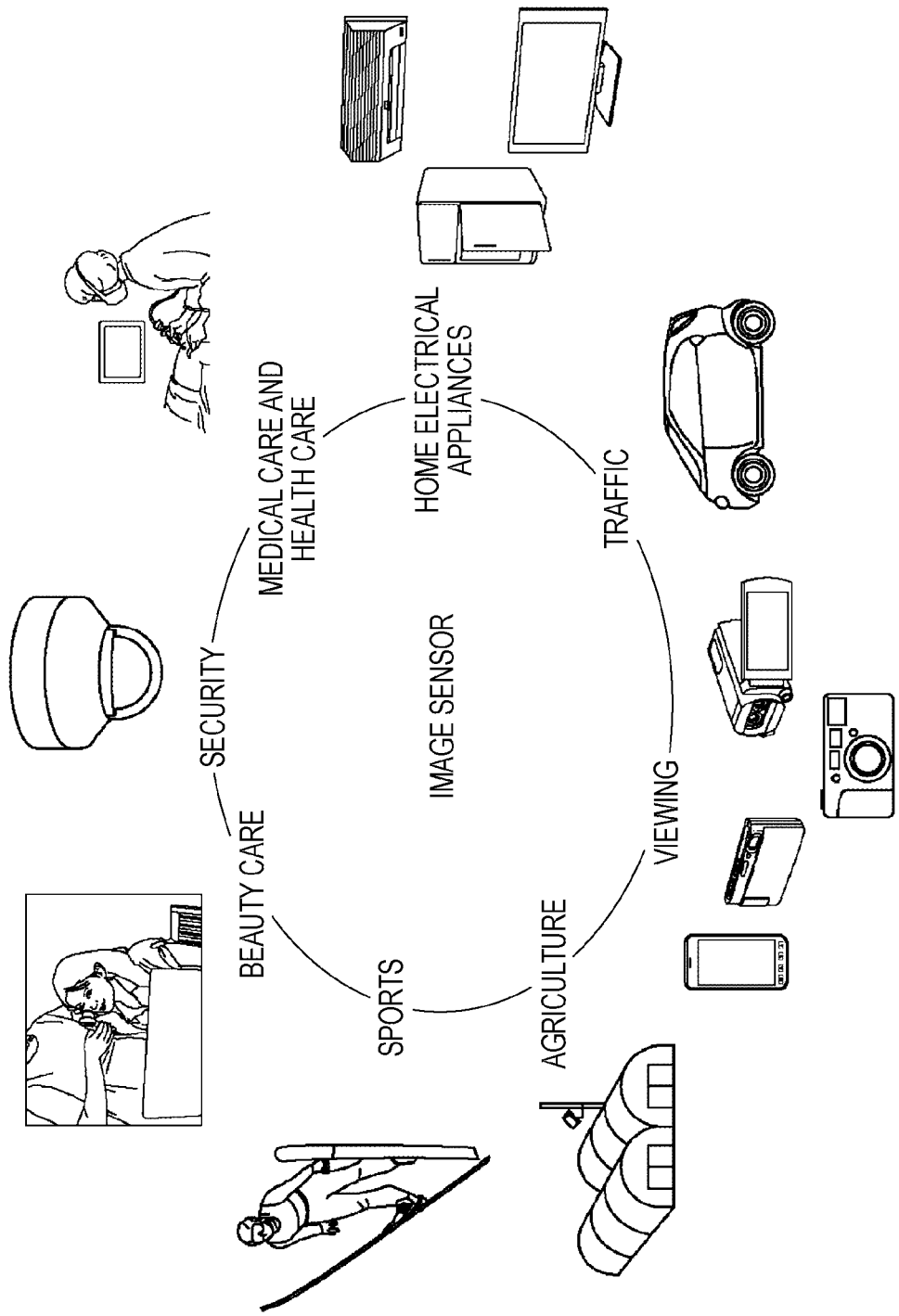
FIG. 25 is a block diagram illustrating configuration of an image-capturing device that is one example of the electronic device of the present disclosure.

FIG. 25 is a block diagram illustrating configuration of an image-capturing device that is an example of the electronic device of the present disclosure. As illustrated in FIG. 25, an image-capturing device 100 according to this example has an image-capturing optical system 101 including a lens group or the like, an image-capturing unit 102, a DSP circuit 103, a frame memory 104, a display device 105, a recording device 106, an operation system 107, a power supply system 108, and the like. In addition, the DSP circuit 103, the frame memory 104, the display device 105, the recording device 106, the operation system 107, and the power supply system 108 are connected to each other via a bus line 109.

The image-capturing optical system 101 captures incident light (image light) from a subject and forms an image on the imaging surface of the image-capturing unit 102. The image-capturing unit 102 converts the light amount of incident light formed on the imaging surface by the optical system 101 into an electrical signal for each pixel and outputs the electrical signal as a pixel signal. The DSP circuit 103 performs typical camera signal processing, such as white balance processing, de-mosaic processing, and gamma correction processing.

The frame memory 104 is used for storing data as appropriate in the process of signal processing in the DSP circuit 103. The display device 105 includes a panel-equipped display device such as a liquid crystal display device or an organic electroluminescence (EL) display device, and displays a moving image or a still image captured by the image-capturing unit 102. The recording device 106 records the moving image or still image captured by the image-capturing unit 102 on a recording medium such as a portable semiconductor memory, an optical disk, or a hard disk drive (HDD).

The operation system 107 issues operation commands for various functions of the image-capturing device 100 according to this example in response to the operation of the user. The power supply system 108 appropriately supplies various power supplies acting as operation power supplies for the DSP circuit 103, the frame memory 104, the display device 105, the recording device 106, and the operation system 107 to these power supply targets.

In the image-capturing device 100 of the configuration mentioned above, the CMOS image sensor 10 described above to which the technology according to the present disclosure is applied can be used as the image-capturing unit 102. By the CMOS image sensor 10 to which the technology according to the present disclosure is applied, in a back-side illumination-type having a charge retention section, the incidence of light on the charge retention section can be suppressed, and therefore a captured image of high image quality with little noise can be obtained.

Application Example to Moving Object

The technology according to the present disclosure can be applied to various products. For example, the technology according to the present disclosure is implemented as apparatuses mounted on any type of moving objects such as automobiles, electric vehicles, hybrid electric vehicles, motorcycles, bicycles, personal mobilities, airplanes, drones, ships, robots, construction machines, and agricultural machines (tractors).

Figure 26:
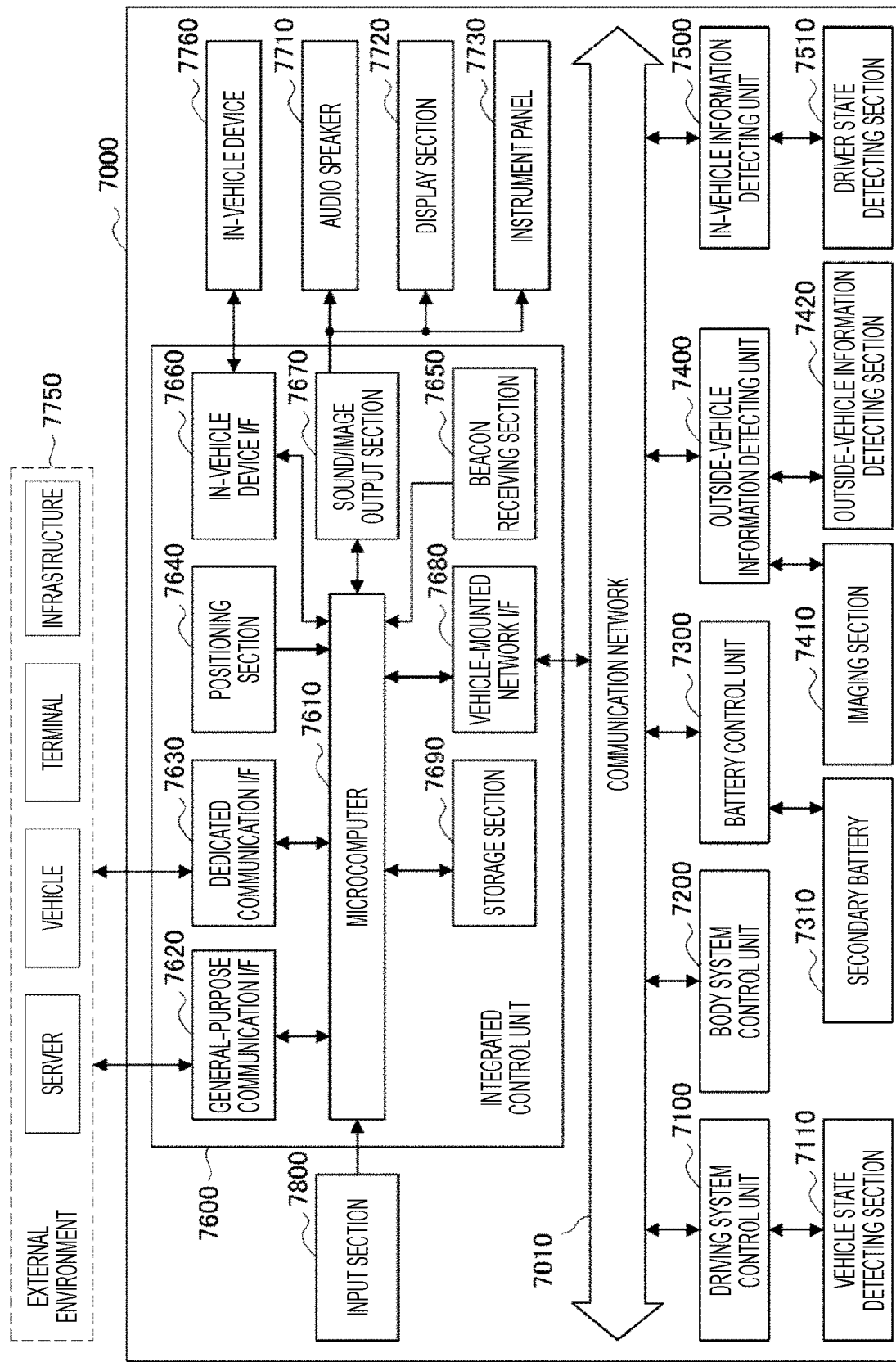
FIG. 26 is a block diagram illustrating schematic configuration example of a vehicle control system that is one example of a moving object control system to which the technology according to the present disclosure is applicable.

FIG. 26 is a block diagram depicting an example of schematic configuration of a vehicle control system 7000 as an example of a moving object control system to which the technology according to an embodiment of the present disclosure can be applied. The vehicle control system 7000 includes a plurality of electronic control units connected to each other via a communication network 7010. In the example depicted in FIG. 26, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay (registered trademark), or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network (I/F for performing communication with other control units via the communication network 7010; and a communication I/F for performing communication with a device, a sensor, or the like within and without the vehicle by wire communication or wireless communication. A functional configuration of the integrated control unit 7600 illustrated in FIG. 26 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, or sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 or an outside-vehicle information detecting section 7420. The imaging section 7410 includes at least one of a time-of-flight (ToF) camera, a stereo camera, a monocular camera, an infrared camera, or other cameras. The outside-vehicle information detecting section 7420, for example, includes at least one of an environmental sensor for detecting current atmospheric conditions or weather conditions or a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, or a snow sensor detecting a snowfall. The peripheral information detecting sensor may be at least one of an ultrasonic sensor, a radar device, or a light detection and ranging, laser imaging detection and ranging (LIDAR) device. Each of the imaging section 7410 and the outside-vehicle information detecting section 7420 may be provided as an independent sensor or device, or may be provided as a device in which a plurality of sensors or devices are integrated.

Figure 27:
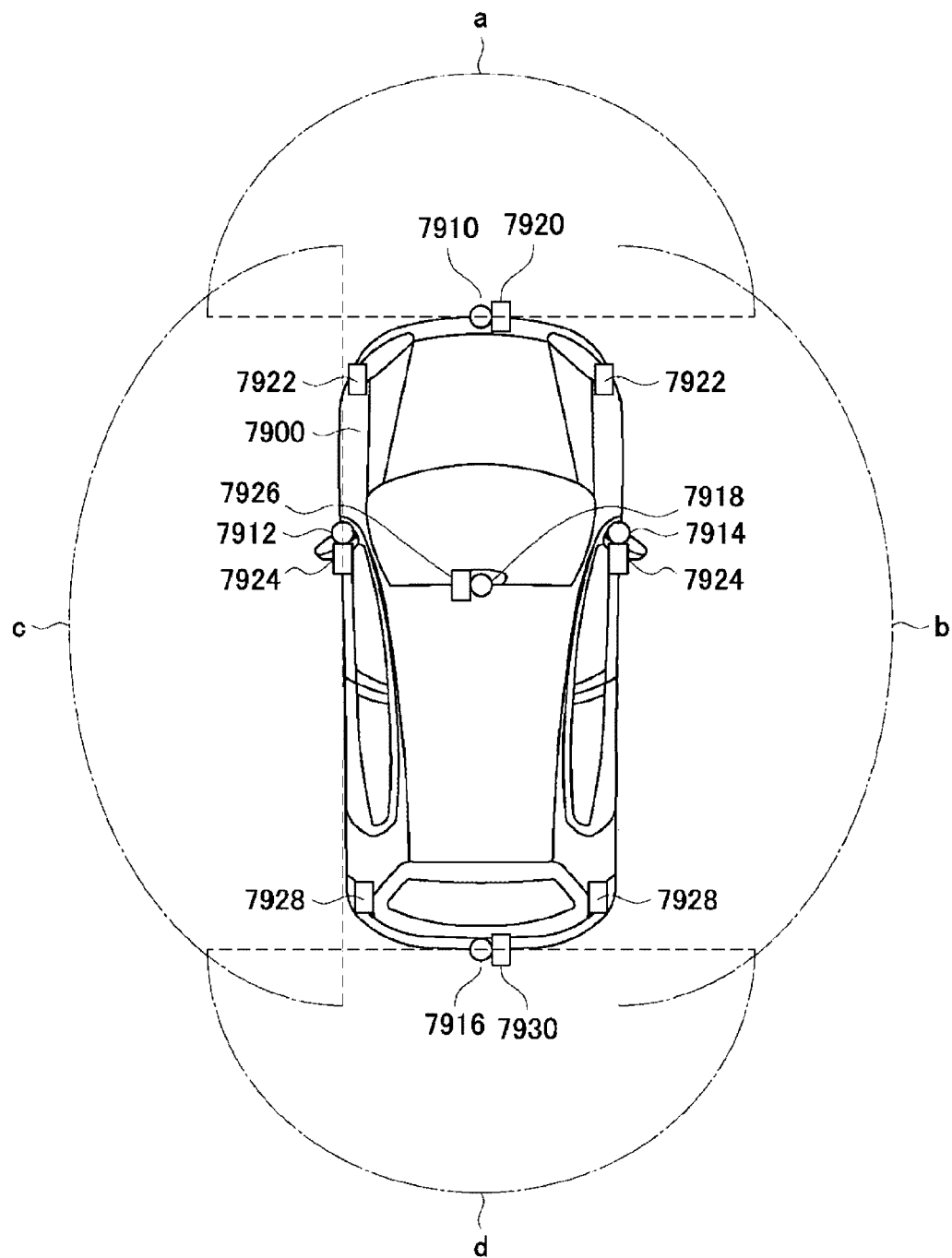
FIG. 27 is a diagram illustrating an example of an installation position of an imaging section unit.

Here, FIG. 27 depicts an example of installation positions of the imaging section 7410 and the outside-vehicle information detecting section 7420. Imaging sections 7910, 7912, 7914, 7916, and 7918 are, for example, disposed at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle 7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Incidentally, FIG. 27 depicts an example of image capturing ranges of the respective imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Returning to FIG. 26, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a bird's-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and that outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system of mobile communications (GSM, registered trademark), WiMAX, long term evolution (LTE), LTE-advanced (LTE-A), or the like, or another wireless communication protocol such as wireless LAN (referred to also as Wi-Fi (registered trademark), Bluetooth (registered trademark), or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of IEEE 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a global positioning system (GPS) signal from a GPS satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a PHS, or a smart phone that has a positioning function.

The beacon receiving section 7650, for example, receives a radio wave or an electromagnetic wave transmitted from a wireless station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth (registered trademark), near field communication (NFC), or wireless USB (WUSB). In addition, the in-vehicle device I/F 7660 may establish wired connection by universal serial bus (USB), high-definition multimedia interface (HDMI, registered trademark), mobile high-definition link (MHL), or the like via a connection terminal (and a cable if necessary) not depicted in the figures. The in-vehicle devices 7760 may, for example, include at least one of a mobile device or a wearable device possessed by an occupant or an information device carried into or attached to the vehicle. Further, the in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, or the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automatic driving, which makes the vehicle travel autonomously without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, or the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound or an image to an output device capable of visually or auditorily notifying an occupant of the vehicle or the outside of the vehicle of information. In the example of FIG. 26, an audio speaker 7710, a display section 7720, and an instrument panel 7730 are illustrated as the output device. The display section 7720 may, for example, include at least one of an on-board display or a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 26 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

The exemplary vehicle control system to which the technology according to the present disclosure is applicable is described above. The technology according to the present disclosure is applicable to, in one example, the imaging sections 7910, 7912, 7914, 7916, and 7918 and the outside-vehicle information detecting sections 7920, 7922, 7924, 7926, 7928, and 7930 among the components described above. In addition, the technology according to the present disclosure applied to the imaging sections 7910, 7912, 7914, 7916, and 7918 and the outside-vehicle information detecting sections 7920, 7922, 7924, 7926, 7928, and 7930 can obtain a captured image of high image quality with little noise, and therefore, it makes it possible to construct the vehicle control system that detects an imaging subject in a high accuracy.

<Configuration that can be Configured by Present Disclosure>

Note that the present disclosure may include the following configuration.

<<A. Solid-State Imaging Element>>

[A-1] A solid-state imaging element including:
a photoelectric conversion section;
a charge retention section configured to retain charge generated by the photoelectric conversion section;
a semiconductor substrate in which the photoelectric conversion section and the charge retention section are formed;
a wiring layer;
an insulating film layer;
a first light blocking film; and
a second light blocking film,
in which the insulating film layer, the first light blocking film, and the wiring layer are stacked on, of the semiconductor substrate, a second face on an opposite side to a first face on which light is incident, in this order from a side near to the second face,
the first light blocking film is
provided so as to cover at least a formation region of the charge retention section and has a protrusion section protruding on a side of the semiconductor substrate in a part corresponding to a formation position of the second light blocking film, and
the second light blocking film has
a first light blocking section placed between a photoelectric conversion section and the charge retention section and extending from the first face of the semiconductor substrate up to partway through the semiconductor substrate,
a second light blocking section placed between a photoelectric conversion section and the charge retention section and configured to be longer than the first light blocking section, and
a third light blocking section covering a part of the first face of the semiconductor substrate.

[A-2] The solid-state imaging element according to [A-1], in which the protrusion section of the first light blocking film is provided in a part corresponding to a formation position of at least one of the first light blocking section or the second light blocking section of the second light blocking film.

[A-3] The solid-state imaging element according to [A-2], in which the protrusion section of the first light blocking film is provided in a part more on a side of the photoelectric conversion section than immediately below the formation position of at least one of the first light blocking section or the second light blocking section of the second light blocking film.

[A-4] The solid-state imaging element according to [A-2], in which the protrusion section of the first light blocking film is provided in a part immediately below the formation position of at least one of the first light blocking section or the second light blocking section of the second light blocking film.

[A-5] The solid-state imaging element according to any one of [A-1] to [A-4],
in which the first light blocking film is provided so as to cover a formation region of the photoelectric conversion section.

[A-6] The solid-state imaging element according to any one of [A-1] to [A-3],
in which the protrusion section of the first light blocking film is provided in a state of protruding into the insulating film layer.

[A-7] The solid-state imaging element according to any one of [A-1] to [A-3],
in which the protrusion section of the first light blocking film is provided in a state of protruding into the semiconductor substrate via the insulating film layer.

[A-8] The solid-state imaging element according to any one of [A-1] to [A-7],
in which the first light blocking section and the second light blocking section are linked via the third light blocking section in a direction parallel to the first face of the semiconductor substrate.

[A-9] The solid-state imaging element according to [A-8],
in which a side face of the photoelectric conversion section is surrounded by the first light blocking section and the second light blocking section.

[A-10] The solid-state imaging element according to [A-9],
in which the first light blocking section is placed at least between a photoelectric conversion section and a transfer gate section configured to transfer charge from the photoelectric conversion section to the charge retention section, and
the second light blocking section is placed at least between a photoelectric conversion section of one unit pixel of mutually adjacent unit pixels and the charge retention section of another unit pixel.

[A-11] The solid-state imaging element according to [A-6],
in which the insulating film layer includes two layers of a first insulating film and a second insulating film with different compositions, and
the first insulating film and the second insulating film are stacked on the second face of the semiconductor substrate in this order from the side near to the second face.

[A-12] The solid-state imaging element according to [A-11],
in which the first insulating film includes an oxide film, and
the second insulating film includes a nitride film.

[A-13] The solid-state imaging element according to [A-12],
in which the insulating film layer is a three-layer structure including a third insulating film including an oxide film on a side of the second insulating film opposite to the first insulating film.

[A-14] The solid-state imaging element according to [A-13],
in which a thickness of the first insulating film is more than or equal to 10 nm,
a thickness of the second insulating film is more than or equal to 50 nm, and
a thickness of the third insulating film is more than or equal to 25 nm.

[A-15] The solid-state imaging element according to any one of [A-11] to [A-14],
in which the second light blocking section pierces the first insulating film and extends up to the second insulating film.

<<B. Solid-State Imaging Element>>

[B-1] A solid-state imaging element including:
a photoelectric conversion section;
a charge retention section configured to retain charge generated by the photoelectric conversion section;
a semiconductor substrate in which the photoelectric conversion section and the charge retention section are formed;
a wiring layer;
an insulating film layer;
a first light blocking film; and
a second light blocking film,
in which the first light blocking film is
provided so as to cover at least a formation region of the charge retention section and has a protrusion section protruding on a side of the semiconductor substrate in a part corresponding to a formation position of the second light blocking film, and
the second light blocking film has
a surface light blocking section provided in a bottom portion of a dug portion of a region of a first face of the semiconductor substrate corresponding to the formation region of the charge retention section, and
a side face light blocking section extending from the surface light blocking section along a side face of the charge retention section.

[B-2] The solid-state imaging element according to [B-1],
in which the protrusion section of the first light blocking film is provided in a state of protruding into the insulating film layer.

[B-3] The solid-state imaging element according to [B-1],
in which the protrusion section of the first light blocking film is provided in a state of protruding into the semiconductor substrate via the insulating film layer.

<<C. Method for Manufacturing a Solid-State Imaging Element>>

[C-1] A method for manufacturing a solid-state imaging element including
a photoelectric conversion section,
a charge retention section configured to retain charge generated by the photoelectric conversion section,
a semiconductor substrate in which the photoelectric conversion section and the charge retention section are formed,
a wiring layer,
an insulating film layer,
a first light blocking film, and
a second light blocking film,
in which the insulating film layer, the first light blocking film, and the wiring layer are stacked on, of the semiconductor substrate, a second face on an opposite side to a first face on which light is incident, in this order from a side near to the second face, the method including:
forming the first light blocking film such that the first light blocking film is provided so as to cover at least a formation region of the charge retention section and a protrusion section protruding on a side of the semiconductor substrate is formed in a part corresponding to a formation position of the second light blocking film; and
forming the second light blocking film such that a first light blocking section extending from the first face of the semiconductor substrate up to partway through the semiconductor substrate is formed between a photoelectric conversion section and the charge retention section, a second light blocking section longer than the first light blocking section is formed between a photoelectric conversion section and the charge retention section, and a third light blocking section covering a part of the first face of the semiconductor substrate is formed.

[C-2] The method for manufacturing the solid-state imaging element according to [C-1],
in which the protrusion section of the first light blocking film is provided in a part corresponding to a formation position of at least one of the first light blocking section or the second light blocking section of the second light blocking film.

[C-3] The method for manufacturing the solid-state imaging element according to [C-2],
in which the protrusion section of the first light blocking film is provided in a part more on a side of the photoelectric conversion section than immediately below the formation position of at least one of the first light blocking section or the second light blocking section of the second light blocking film.

[C-4] The method for manufacturing the solid-state imaging element according to [C-2],
in which the protrusion section of the first light blocking film is provided in a part immediately below the formation position of at least one of the first light blocking section or the second light blocking section of the second light blocking film.

[C-5] The method for manufacturing the solid-state imaging element according to any one of [C-1] to [C-4],
in which the first light blocking film is provided so as to cover a formation region of the photoelectric conversion section.

[C-6] The method for manufacturing the solid-state imaging element according to any one of [C-1] to [C-3],
in which the protrusion section of the first light blocking film is provided in a state of protruding into the insulating film layer.

[C-7] The method for manufacturing the solid-state imaging element according to any one of [C-1] to [C-3],
in which the protrusion section of the first light blocking film is provided in a state of protruding into the semiconductor substrate via the insulating film layer.

[C-8] The method for manufacturing the solid-state imaging element according to any one of [C-1] to [C-7],
in which the first light blocking section and the second light blocking section are linked via the third light blocking section in a direction parallel to the first face of the semiconductor substrate.

[C-9] The method for manufacturing the solid-state imaging element according to [C-8],
in which a side face of the photoelectric conversion section is surrounded by the first light blocking section and the second light blocking section.

[C-10] The method for manufacturing the solid-state imaging element according to [C-9],
in which the first light blocking section is placed at least between a photoelectric conversion section and a transfer gate section configured to transfer charge from the photoelectric conversion section to the charge retention section, and
the second light blocking section is placed at least between a photoelectric conversion section of one unit pixel of mutually adjacent unit pixels and the charge retention section of another unit pixel.

[C-11] The method for manufacturing the solid-state imaging element according to [C-6],
in which the insulating film layer includes two layers of a first insulating film and a second insulating film with different compositions, and
the first insulating film and the second insulating film are stacked on the second face of the semiconductor substrate in this order from the side near to the second face.

[C-12] The method for manufacturing the solid-state imaging element according to [C-11],
in which the first insulating film includes an oxide film, and
the second insulating film includes a nitride film.

[C-13] The method for manufacturing the solid-state imaging element according to [C-12],
in which the insulating film layer is a three-layer structure including a third insulating film including an oxide film on a side of the second insulating film opposite to the first insulating film.

[C-14] The method for manufacturing the solid-state imaging element according to [C-13],
in which a thickness of the first insulating film is more than or equal to 10 nm,
a thickness of the second insulating film is more than or equal to 50 nm, and
a thickness of the third insulating film is more than or equal to 25 nm.

[C-15] The method for manufacturing the solid-state imaging element according to any one of [C-11] to [C-14],
in which the second light blocking section pierces the first insulating film and extends up to the second insulating film.

<<D. Electronic Device>>

[D-1] An electronic device including:
a solid-state imaging element including
a photoelectric conversion section,
a charge retention section configured to retain charge generated by the photoelectric conversion section,
a semiconductor substrate in which the photoelectric conversion section and the charge retention section are formed,
a wiring layer,
an insulating film layer,
a first light blocking film, and
a second light blocking film,
in which the insulating film layer, the first light blocking film, and the wiring layer are stacked on, of the semiconductor substrate, a second face on an opposite side to a first face on which light is incident, in this order from a side near to the second face,
the first light blocking film is
provided so as to cover at least a formation region of the charge retention section and has a protrusion section protruding on a side of the semiconductor substrate in a part corresponding to a formation position of the second light blocking film, and
the second light blocking film has
a first light blocking section placed between a photoelectric conversion section and the charge retention section and extending from the first face of the semiconductor substrate up to partway through the semiconductor substrate,
a second light blocking section placed between a photoelectric conversion section and the charge retention section and configured to be longer than the first light blocking section, and
a third light blocking section covering a part of the first face of the semiconductor substrate.

[D-2] The electronic device according to [D-1],
in which the protrusion section of the first light blocking film is provided in a part corresponding to a formation position of at least one of the first light blocking section or the second light blocking section of the second light blocking film.

[D-3] The electronic device according to [D-2],
in which the protrusion section of the first light blocking film is provided in a part more on a side of the photoelectric conversion section than immediately below the formation position of at least one of the first light blocking section or the second light blocking section of the second light blocking film.

[D-4] The electronic device according to [D-2],
in which the protrusion section of the first light blocking film is provided in a part immediately below the formation position of at least one of the first light blocking section or the second light blocking section of the second light blocking film.

[D-5] The electronic device according to any one of [D-1] to [D-4],
in which the first light blocking film is provided so as to cover a formation region of the photoelectric conversion section.

[D-6] The electronic device according to any one of [D-1] to [D-3],
in which the protrusion section of the first light blocking film is provided in a state of protruding into the insulating film layer.

[D-7] The electronic device according to any one of [D-1] to [D-3],
in which the protrusion section of the first light blocking film is provided in a state of protruding into the semiconductor substrate via the insulating film layer.

[D-8] The electronic device according to any one of [D-1] to [D-7],
in which the first light blocking section and the second light blocking section are linked via the third light blocking section in a direction parallel to the first face of the semiconductor substrate.

[D-9] The electronic device according to [D-8],
in which a side face of the photoelectric conversion section is surrounded by the first light blocking section and the second light blocking section.

[D-10] The electronic device according to [D-9],
in which the first light blocking section is placed at least between a photoelectric conversion section and a transfer gate section configured to transfer charge from the photoelectric conversion section to the charge retention section, and
the second light blocking section is placed at least between a photoelectric conversion section of one unit pixel of mutually adjacent unit pixels and the charge retention section of another unit pixel.

[D-11] The electronic device according to [D-6],
in which the insulating film layer includes two layers of a first insulating film and a second insulating film with different compositions, and
the first insulating film and the second insulating film are stacked on the second face of the semiconductor substrate in this order from the side near to the second face.

[D-12] The electronic device according to [D-11],
in which the first insulating film includes an oxide film, and
the second insulating film includes a nitride film.

[D-13] The electronic device according to [D-12],
in which the insulating film layer is a three-layer structure including a third insulating film including an oxide film on a side of the second insulating film opposite to the first insulating film.

[D-14] The electronic device according to [D-13],
in which a thickness of the first insulating film is more than or equal to 10 nm,
a thickness of the second insulating film is more than or equal to 50 nm, and
a thickness of the third insulating film is more than or equal to 25 nm.

[D-15] The electronic device according to any one of [D-11] to [D-14],
in which the second light blocking section pierces the first insulating film and extends up to the second insulating film.

REFERENCE SIGNS LIST

10 CMOS image sensor
11 Pixel array section
12 Vertical driving section
13 Column processing section
14 Horizontal driving section
15 System control section
16 ($16_1$ to $16_m$) Pixel driving line
17 ($17_1$ to $17_n$) Vertical signal line
18 Signal processing section
19 Data storage section
20 Unit pixel
21 Photodiode (photoelectric conversion section)
22 First transfer gate section
23 Second transfer gate section
24 Charge retention section (MEM)
25 Floating diffusion region
26 Third transfer gate section
27 Reset transistor
28 Amplification transistor
29 Selection transistor
33 Overflow gate section
51 Semiconductor substrate
52 Insulating film layer
52A First insulating film
52B Second insulating film
52C Third insulating film
53 First light blocking film
53A, 53B Protrusion section
53C Flat section (main body section)
54 Wiring layer
55 Gate electrode
56 Multiple-layer film
57 Second light blocking film
57A Surface light blocking section (third light blocking section)
57B Not-piercing light blocking section (first light blocking section)
57C Piercing light blocking section (second light blocking section)
57D Side face light blocking section

What is claimed is:
1. A solid-state imaging element, comprising:
a photoelectric conversion section;
a charge retention section configured to retain charge generated by the photoelectric conversion section;
a semiconductor substrate in which the photoelectric conversion section and the charge retention section are formed;
a first transfer gate section including a first gate electrode;
a second transfer gate section including first and second second gate electrodes; and
a third transfer gate section including a third gate electrode,
wherein the first transfer gate section transfers to the charge retention section the charge generated by the photoelectric conversion section and obstructs backflow of charge from the charge retention section to the photoelectric conversion section,
wherein the second transfer gate section causes the charge retention section to retain the charge generated by the photoelectric conversion section, and
wherein the charge retention section is superimposed on the first gate electrode, the first second gate electrode and the second second gate electrode in a plan view.

2. The solid-state imaging element according to claim 1, further comprising:
a reset transistor including a reset gate electrode;
an amplification transistor including an amplification gate electrode; and a selection transistor including a selection gate electrode,
wherein the reset gate electrode, the amplification gate electrode and the selection gate electrode are provided at a right-hand side of the photoelectric conversion section in a vertical direction in the plan view.

3. The solid-state imaging element according to claim 2, wherein n-channel Metal Oxide Semiconductor (MOS) transistors are used for the reset transistor, amplification transistor and selection transistors.

4. The solid-state imaging element according to claim 1, further comprising an overflow gate section including an overflow gate electrode, wherein the overflow gate electrode is provided at a left-hand side of the photoelectric conversion section in the plan view.

5. The solid-state imaging element according to claim 1, further comprising:
a first light blocking section extending from a first face of the semiconductor substrate up to partway through the semiconductor substrate, and
a second light blocking section configured to be longer than the first light blocking section.

6. The solid-state imaging element according to claim 5, wherein the first light blocking section is provided between the photoelectric conversion section and the first gate electrode.

7. The solid-state imaging element according to claim 5, wherein the second light blocking section is provided between the photoelectric conversion section and the first and second second gate electrodes.

8. The solid-state imaging element according to claim 5, wherein the second light blocking section is provided between the photoelectric conversion section and the charge retention section.

9. The solid-state imaging element according to claim 5, wherein the first light blocking section and the second light blocking section are linked via a third light blocking section in a direction parallel to the first face of the semiconductor substrate.

10. The solid-state imaging element according to claim 9, wherein a side face of the photoelectric conversion section is surrounded by the first light blocking section and the second light blocking section.

11. The solid-state imaging element according to claim 5, wherein the first light blocking section is provided so as to cover a formation region of the photoelectric conversion section.

12. The solid-state imaging element according to claim 5, wherein a width of the second light blocking section is wider than a width of the first light blocking section.

13. A method for manufacturing a solid-state imaging element, including:
a photoelectric conversion section;
a charge retention section configured to retain charge generated by the photoelectric conversion section;
a semiconductor substrate in which the photoelectric conversion section and the charge retention section are formed;
a first transfer gate section including a first gate electrode;
a second transfer gate section including first and second second gate electrodes; and
a third transfer gate section including a third gate electrode,
wherein the first transfer gate section transfers to the charge retention section the charge generated by the photoelectric conversion section and obstructs backflow of charge from the charge retention section to the photoelectric conversion section,
wherein the second transfer gate section causes the charge retention section to retain the charge generated by the photoelectric conversion section, the method comprising:
forming the charge retention section to be superimposed on the first gate electrode, the first second gate electrode and the second second gate electrode in a plan view.

14. An electronic device, comprising:
a solid-state imaging element configured to detect light; and
a signal processor configured to process a signal output from the solid-state imaging element,
wherein the solid-state imaging element includes:
a photoelectric conversion section;
a charge retention section configured to retain charge generated by the photoelectric conversion section;
a semiconductor substrate in which the photoelectric conversion section and the charge retention section are formed;
a first transfer gate section including a first gate electrode;
a second transfer gate section including first and second second gate electrodes; and
a third transfer gate section including a third gate electrode,
wherein the first transfer gate section transfers to the charge retention section the charge generated by the photoelectric conversion section and obstructs backflow of charge from the charge retention section to the photoelectric conversion section,
wherein the second transfer gate section causes the charge retention section to retain the charge generated by the photoelectric conversion section and
wherein the charge retention section is superimposed on the first gate electrode, the first second gate electrode and the second second gate electrode in a plan view.

15. The electronic device according to claim 14, further comprising:
a reset transistor including a reset gate electrode;
an amplification transistor including an amplification gate electrode; and
a selection transistor including a selection gate electrode,
wherein the reset gate electrode, the amplification gate electrode and the selection gate electrode are provided at a right-hand side of the photoelectric conversion section in a vertical direction in the plan view.

16. The electronic device according to claim 15, wherein n-channel Metal Oxide Semiconductor (MOS) transistors are used for the reset transistor, amplification transistor and selection transistors.

17. The electronic device according to claim 14, further comprising an overflow gate section including an overflow gate electrode, wherein the overflow gate electrode is provided at a left-hand side of the photoelectric conversion section in the plan view.

18. The electronic device according to claim 14, further comprising:
a first light blocking section extending from a first face of the semiconductor substrate up to partway through the semiconductor substrate, and
a second light blocking section configured to be longer than the first light blocking section.

19. The electronic device according to claim 18, wherein the first light blocking section is provided between the photoelectric conversion section and the first gate electrode.

20. The electronic device according to claim 18, wherein the second light blocking section is provided between the photoelectric conversion section and the first and second second gate electrodes.

* * * * *